(12) United States Patent
Seki et al.

(10) Patent No.: US 8,246,887 B2
(45) Date of Patent: Aug. 21, 2012

(54) IMPRINT METHOD AND PROCESS FOR PRODUCING A CHIP THAT CHANGE A RELATIVE POSITION BETWEEN A MEMBER TO BE PROCESSED AND A SUPPORT PORTION

(75) Inventors: Junichi Seki, Yokohama (JP); Masao Majima, Isehara (JP); Nobuhito Suehira, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 380 days.

(21) Appl. No.: 11/876,058

(22) Filed: Oct. 22, 2007

(65) Prior Publication Data

US 2008/0042320 A1 Feb. 21, 2008

Related U.S. Application Data

(62) Division of application No. 11/448,033, filed on Jun. 7, 2006, now Pat. No. 7,635,260.

(30) Foreign Application Priority Data

Jun. 7, 2005 (JP) .................................. 2005-167417

(51) Int. Cl.
*B28B 5/02* (2006.01)
*B28B 11/08* (2006.01)
*B29C 59/00* (2006.01)
*B29C 59/02* (2006.01)

(52) U.S. Cl. ........ 264/294; 264/293; 264/319; 264/320; 264/496; 977/887

(58) Field of Classification Search ............... 264/496, 264/293, 320; 977/887
See application file for complete search history.

(56) References Cited

U.S. PATENT DOCUMENTS 2,959,502 A * 11/1960 Gaertner ..................... 438/352
(Continued)

FOREIGN PATENT DOCUMENTS

JP 07-099197 4/1995
(Continued)

OTHER PUBLICATIONS

Hiroshima, Hiroshi. "Photo-nanoimprinting using SOFT (Sample on Flexible Thruster Stage," G.Y. Chen, et al., Nano Lett., 4(2004) 1225, presented Oct. 26-28, 2005, Microprocesses and Nanotechnology 2005, 2005 International Microprocesses and Nanotechnology Conference, Tokyo, Japan. pp. 256-257.

(Continued)

*Primary Examiner* — Christina Johnson
*Assistant Examiner* — Benjamin Schiffman
(74) *Attorney, Agent, or Firm* — Fitzpatrick, Cella, Harper & Scinto

(57) ABSTRACT

An imprint method includes (i) holding a mold by a first holding portion, (ii) holding, by a second holding portion, a member to be processed so that the member to be processed is capable of bending by its own weight, (iii) supporting, by a support portion, a back surface of the member to be processed in a first area so that an amount of the bending is decreased, (iv) pressing a pattern of the mold against a front surface of the member to be processed, which is supported by the support portion in the first area, (v) supporting, by the support portion, the back surface of the member to be processed in a second area different from the first area, so that the amount of the bending is decreased, by changing a relative position between the member to be processed and the support portion, and (vi) pressing the pattern of the mold against the front surface of the member to be processed, which is supported by the support portion in the second area.

15 Claims, 15 Drawing Sheets

U.S. PATENT DOCUMENTS

| | | | |
|---|---|---|---|
| 3,945,790 A | 3/1976 | Puech | 425/385 |
| 4,584,157 A | 4/1986 | Sweig | 264/522 |
| 5,504,627 A | 4/1996 | Kim et al. | 359/729 |
| 5,772,905 A | 6/1998 | Chou | 216/44 |
| 6,334,960 B1 | 1/2002 | Willson et al. | 216/52 |
| 6,387,787 B1 | 5/2002 | Mancini et al. | 435/586 |
| 6,517,977 B2 | 2/2003 | Resnick et al. | 430/5 |
| 6,580,172 B2 | 6/2003 | Mancini et al. | 257/762 |
| 6,646,662 B1 | 11/2003 | Nebashi et al. | 346/140.1 |
| 6,695,298 B1 * | 2/2004 | Hertz et al. | 269/266 |
| 6,696,220 B2 | 2/2004 | Bailey et al. | 430/272.1 |
| 6,719,915 B2 | 4/2004 | Willson et al. | 216/44 |
| 6,818,139 B1 | 11/2004 | Lee et al. | 216/49 |
| 6,829,988 B2 | 12/2004 | George et al. | 101/17 |
| 6,940,591 B2 | 9/2005 | Sopp et al. | 356/244 |
| 6,943,117 B2 | 9/2005 | Jeong et al. | 438/694 |
| 7,060,324 B2 | 6/2006 | Bailey et al. | 427/264 |
| 2003/0141017 A1 | 7/2003 | Fujisato | 156/345.47 |
| 2003/0170053 A1 | 9/2003 | Montelius et al. | 399/318 |
| 2004/0008344 A1 | 1/2004 | Sopp et al. | 356/244 |
| 2004/0170771 A1 | 9/2004 | Bailey et al. | 427/421.1 |
| 2004/0192041 A1 | 9/2004 | Jeong et al. | 438/689 |
| 2005/0064054 A1 * | 3/2005 | Kasumi | 425/112 |
| 2005/0082698 A1 | 4/2005 | Gutman et al. | 264/1.33 |
| 2005/0186304 A1 | 8/2005 | Seki | 425/416 |
| 2006/0273488 A1 | 12/2006 | Seki et al. | 264/293 |

FOREIGN PATENT DOCUMENTS

| | | |
|---|---|---|
| JP | 2000-194142 | 7/2000 |
| JP | 2003-77867 | 3/2003 |
| JP | 2005-77867 | 3/2005 |
| JP | 2005-101313 | 4/2005 |
| KR | 10-2005-0077897 | 8/2005 |
| WO | WO 01/33300 A2 | 5/2001 |
| WO | WO 01/42858 A1 | 6/2001 |
| WO | WO 2004/044651 A1 | 5/2004 |
| WO | WO 2004/099879 A2 | 11/2004 |
| WO | WO 2005/119802 A2 | 12/2005 |

OTHER PUBLICATIONS

Chou, Stephen Y., et al. "Imprint of sub-25 nm vias and trenches in polymers," Appl. Phys. Lett., vol. 67, Issue 21, Nov. 20, 1995. pp. 3114-3116.

European Search Report dated Oct. 25, 2006, issued in corresponding European patent Application No. EP 06 11 5095, forwarded in a Communication dated Nov. 13, 2006.

Colburn, M., et al. "Imprint of sub-25 nm vias and trenches in polymers," Appl. Phys. Lett., vol. 67, Issue 21, Nov. 20, 1995. pp. 3114-3116.

Hiroshima, Hiroshi. "SOFT (Sample on Flexible Thruster) Stage for Step-and-Repeat Nanoimprinter," presented in *The Fourth International Conference on Nanoimprint and Nanoimprint Technology Digest of Papers*, Oct. 19-21, 2005, Nara, Japan (3 pages).

Notice of Allowance issued from the Korean Intellectual Property Office dated Nov. 13, 2007, issued in corresponding Korean patent application No. 10-2006-0050739.

Communication pursuant to Article 94(3) EPC dated Jan. 29, 2008, issued in corresponding European patent application No. 06 115 095.9.

English translation of Chinese Office Action dated Feb. 29, 2008, issued in corresponding Chinese patent application No. 2006-10091718.1.

Communication pursuant to Article 94(3) EPC, mailed in a Communication dated Oct. 10, 2008, in copending European patent application No. 06 115 095.9.

Taiwan IPO Search Report completed Feb. 20, 2009, mailed in a Taiwan Office Action dated Apr. 15, 2009, in copending Taiwan patent application No. 095120253, with their respective English translations.

Chinese Official Action dated May 20, 2011, issued in counterpart Chinese patent application No. 200910203848.3, with an English translation.

* cited by examiner

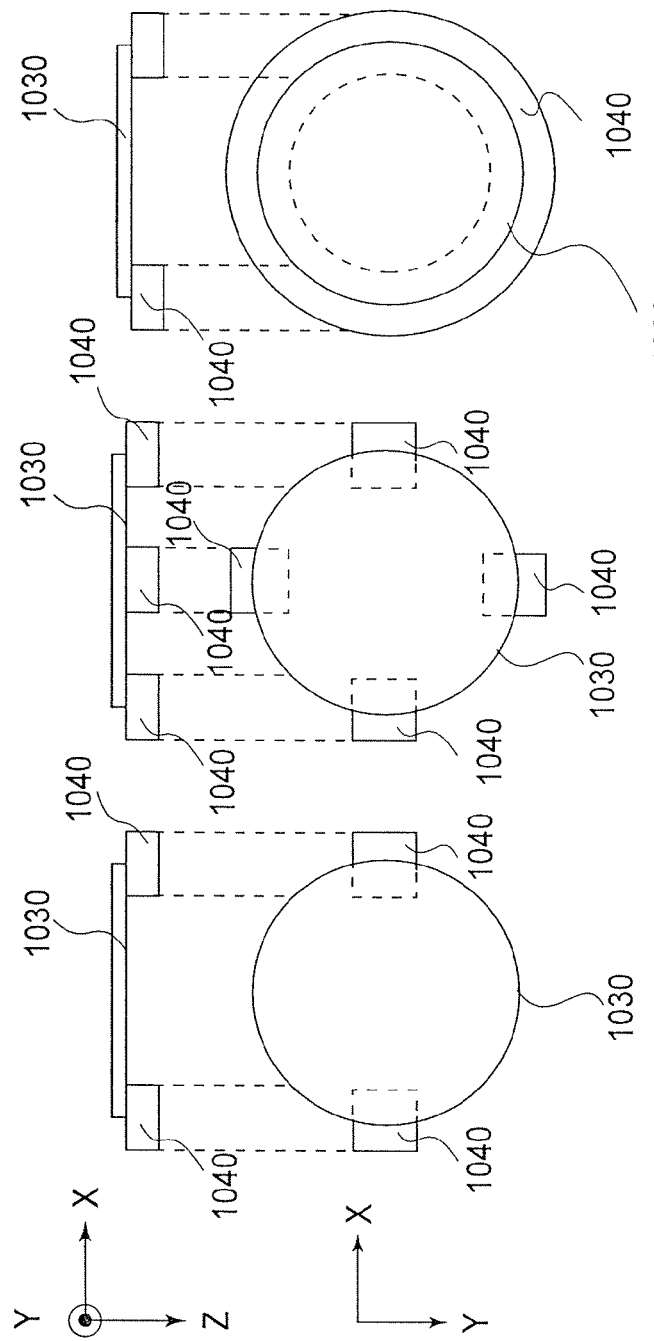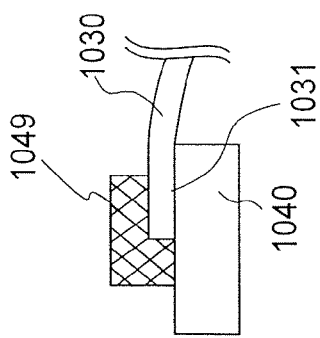

IMPRINT METHOD AND PROCESS FOR PRODUCING A CHIP THAT CHANGE A RELATIVE POSITION BETWEEN A MEMBER TO BE PROCESSED AND A SUPPORT PORTION

This application is a divisional application of copending U.S. patent application Ser. No. 11/448,033, filed Jun. 7, 2006.

FIELD OF THE INVENTION AND RELATED ART

The present invention relates to a processing apparatus, a processing method, and a process for producing a chip. The present invention also relates to a pattern transfer apparatus and a pattern transfer method, and particularly, to a pattern transfer apparatus for transferring a pattern on a member to be processed (hereinafter, referred to as a "processing member") by using a mold having the pattern (hereinafter, also referred to as a "template").

In recent years, as proposed in Appl. Phys. Lett., Vol. 67, Issue 21, pp. 3114-3116 (1995) by Stephan Y. Chou et al., fine processing technology for transferring a minute structure on a mold onto a processing member, such as a resin or a metal, has been developed and has received attention. This technology is called nanoimprint or nanoembossing, and is expected to realize a resolution on the order of several nanometers, so that expectations are growing that the technology is used as next-generation semiconductor fabrication technology in place of a light exposure apparatus, such as a stepper or a scanner. Further, a space structure can be processed at a wafer level as a whole, so that the technology described above has been expected to be applied to a wide variety of fields of production technologies of optical devices, such as photonic crystal and biochips, such as μ-TAS (Micro Total Analysis System).

In Processings of the SPIE's 24th International Symposium on Microlithography: Emerging Lithographic Technologies III, Santa Clara, Calif., Vol. 3676, Part One, pp. 379-389, March (1999), a processing method has been proposed, in which a minute structure is formed at a surface of a quartz substrate smaller than a work as the processing member to prepare a mold and is then transferred onto the work, i.e., imprint lithography.

More specifically, the mold is pressed against a work onto which a UV curable resin is applied and is irradiated with UV light to cure the UV curable resin, thus transferring the minute structure onto the work. Then, by using a stage, the mold and the work are moved relative to each other to repeat pattern transfer, thus processing the entire surface of the work similarly as in the case of a stepper as a representative light exposure apparatus.

Further, Japanese Laid-Open Patent Application (JP-A) No. 2003-77867 has proposed a technique utilizing an inclination adjusting mechanism in order to apply a pressure to a mold in a pattern forming area with a uniform pressure distribution.

More specifically, as shown in FIG. 15, a silicon substrate 1103 provided with a resist 1104 is supported by an elastic member 1107 at a peripheral portion thereof.

At a position opposite to a mold 1102, an oscillating member 1114, which supports a silicon substrate 1103 from its back side and functions as a receiving portion of a pivot 1113, is disposed on a fixed supporting strut 1111. In FIG. 15, the case in which a mold 1102 is somewhat inclined, that is, a surface thereof is not parallel to the substrate surface is shown. The mechanism further includes a mold holding portion 1101, a sample holding member 1105, a moving stage 1106, a level block 1108, and a moving mechanism 1110.

In this mechanism, after the resist 1104 and the mold 1102 come in contact with each other, parallelism between the mold 1102 and the silicon substrate 1103 is increased with a decrease in a distance between the resist 1104 and the mold 1102, i.e., an increase in a pressing force received by the resin, thus improving a pressing uniformity in the pattern forming area during imprinting.

Incidentally, the processing member on which a pattern is formed by imprinting is bent, in some cases, depending on a size thereof, a constituting material, etc.

For example, with respect to the bending of the processing member by its own weight, in the case of complete constraint, at a peripheral portion, considered a smallest amount of bending, the bending amount is approximately 20 μm for a 300 mm Si wafer, although it varies depending on a manner of holding the wafer constituting the processing member.

Such an influence due to the bending of the processing member during the imprinting is not considered in JP-A 2003-77867 described above.

SUMMARY OF THE INVENTION

An object of the present invention is to provide an imprint apparatus capable of alleviating an influence due to bending of a processing member during imprinting.

Another object of the present invention is to provide an imprint method and a process for producing a chip using the imprint apparatus.

According to an aspect of the present invention, there is provided an imprint apparatus for forming an imprinted pattern on a member to be processed by using a mold having a pattern, the apparatus comprising:

a first holding portion for holding the mold;

a second holding portion for holding the member to be processed; and a support portion for partially supporting the member to be processed at a support position opposite to the mold held by the first holding portion, wherein the second holding portion is movable in a first direction so that the support position, relative to the second holding portion, of the support portion for partially supporting the member to be processed is changed, and wherein the support portion and the second holding portion are movable relative to each other, independently of the first holding portion, in a second direction perpendicular to the first direction so that the support portion is moved apart from the member to be processed.

According to another aspect of the present invention, there is provided an imprint apparatus for forming an imprinted pattern on a member to be processed by using a mold having a pattern at a processing surface thereof, the apparatus comprising:

a first holding portion for holding the mold;

a second holding portion for holding the member to be processed; and a support portion for partially supporting the member to be processed at a support position opposite to the mold held by the first holding portion, wherein the second holding portion is movable in a direction parallel to the processing surface so that the support position, relative to the second holding portion, of the support portion for partially supporting the member to be processed is changed, and wherein the support portion and the second holding portion are movable relative to each other, independently of the first holding portion, in a second direction perpendicular to the processing surface so that the support portion is moved apart from the member to be processed.

According to another aspect of the present invention, there is provided an imprint apparatus for forming an imprinted pattern on a member to be processed by using a mold having a pattern, the apparatus comprising:

a first holding portion for holding the mold;

a second holding portion for holding the member to be processed; and a support portion for partially supporting the member to be processed at a position opposite to the mold held by the first holding portion, wherein the mold and the support portion determine a pressurizing axis for pressuring the member to be processed, and wherein the support portion and the second holding portion are movable relative to each other, independently of the first holding portion, in a direction parallel to the pressurizing axis so that the support portion is moved apart from the member to be processed.

According to another aspect of the present invention, there is provided an imprint method for forming an imprinted pattern on a member to be processed by using a mold having a pattern, the method comprising:

pushing up the member, to be processed, held so as to be capable of being bent by its own weight by a support portion movable in a direction opposite to a direction of gravitation so that an amount of bending in the direction of gravitation is decreased, thereby to form the imprinted pattern on the member to be processed.

According to another aspect of the present invention, there is provided an imprint method for forming an imprinted pattern on a member to be processed by using a mold having a pattern on a processing surface thereof, the method comprising:

disposing the member to be processed between a first holding portion for holding the mold and a support portion disposed at a position opposite to the processing surface of the mold;

determining a pattern transfer area by moving the member to be processed to be held by a second holding portion by the second holding portion in a direction parallel to the processing surface in a state in which the support portion is moved away from the member to be processed so as not to contact the member to be processed;

causing the support portion and the member to be processed to contact each other by moving them relative to each other in a direction perpendicular to the processing surface depending on positional information about the pattern transfer area in the direction perpendicular to the processing surface;

causing the processing surface of the mold and the member to be processed to contact each other; and forming the imprinted pattern on the member to be processed by using the pattern provided at the processing surface of the mold.

According to another aspect of the present invention, there is provided a process for producing a chip, the process comprising:

preparing a mold; and preparing an imprinted pattern on the member to be processed by using an imprint apparatus according to the imprint apparatus described above.

The present invention also provides a pressure imprint apparatus and a pressure imprint method constituted as described below.

The pressure imprint apparatus includes a mold holding portion (hereinafter also referred to as a first holding portion or a mold pressing portion) and a work pressing portion (hereinafter also referred to as a work support portion) disposed at a position opposite to the mold holding portion and transfers a pattern formed on a processing surface of a mold onto a work held by a work support portion (hereinafter also referred to as a work holding portion). The pressure imprint apparatus is characterized by including a work position control mechanism for moving the work in an in-plane direction parallel to a processing surface of the mold to control the position of the work and a pressing position adjusting mechanism for moving the work pressing portion and the work relative to each other in a direction perpendicular to the processing surface of the mold to adjust a pressing position of the work pressing portion with respect to the work.

The pressure imprint method uses the mold holding portion and the work pressing portion disposed at the position opposite to the mold holding portion and transfers the pattern formed on the processing surface of the mold onto the work. The pressure imprint method includes the following steps 1) to 3):

1) a step of moving the work pressing portion away from the mold and the work and moving the work to a desired position in an in-plane direction parallel to the processing surface of the mold, 2) a step of adjusting a pressing position of the work pressing portion with respect to the work by moving the work pressing portion and the work relative to each other in a direction perpendicular to the processing surface of the mold to cause them to contact each other after the work is moved to the desired position, and 3) a step of transferring the pattern formed on the processing surface of the mold onto the work by pressing the mold against the work at the adjusted pressing portion.

In step 2), the pressure imprint method can further include a process for adjusting the pressing position on the basis of a result of detection of the pressing position with respect to the work. Further, it is also possible to employ a process for adjusting the pressing position by computing the pressing position depending on the position of the mold controlled by the above-described work position control mechanism. It is further possible to employ a process for correcting the pressing position while taking a change in pressing position during the pressing operation due to bending of respective portions into consideration.

By using the above-described constitutions of the present invention, it is possible to provide an imprint apparatus and an imprint method which are capable of alleviating the influence due to the bending of the processing member (member to be processed) during the imprinting.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 2A to 2D are schematic views illustrating a second holding portion in an embodiment of the present invention.

DETAILED DESCRIPTION OF THE PREFERRED EMBODIMENTS

First Embodiment

Imprint Apparatus

Figure 1:
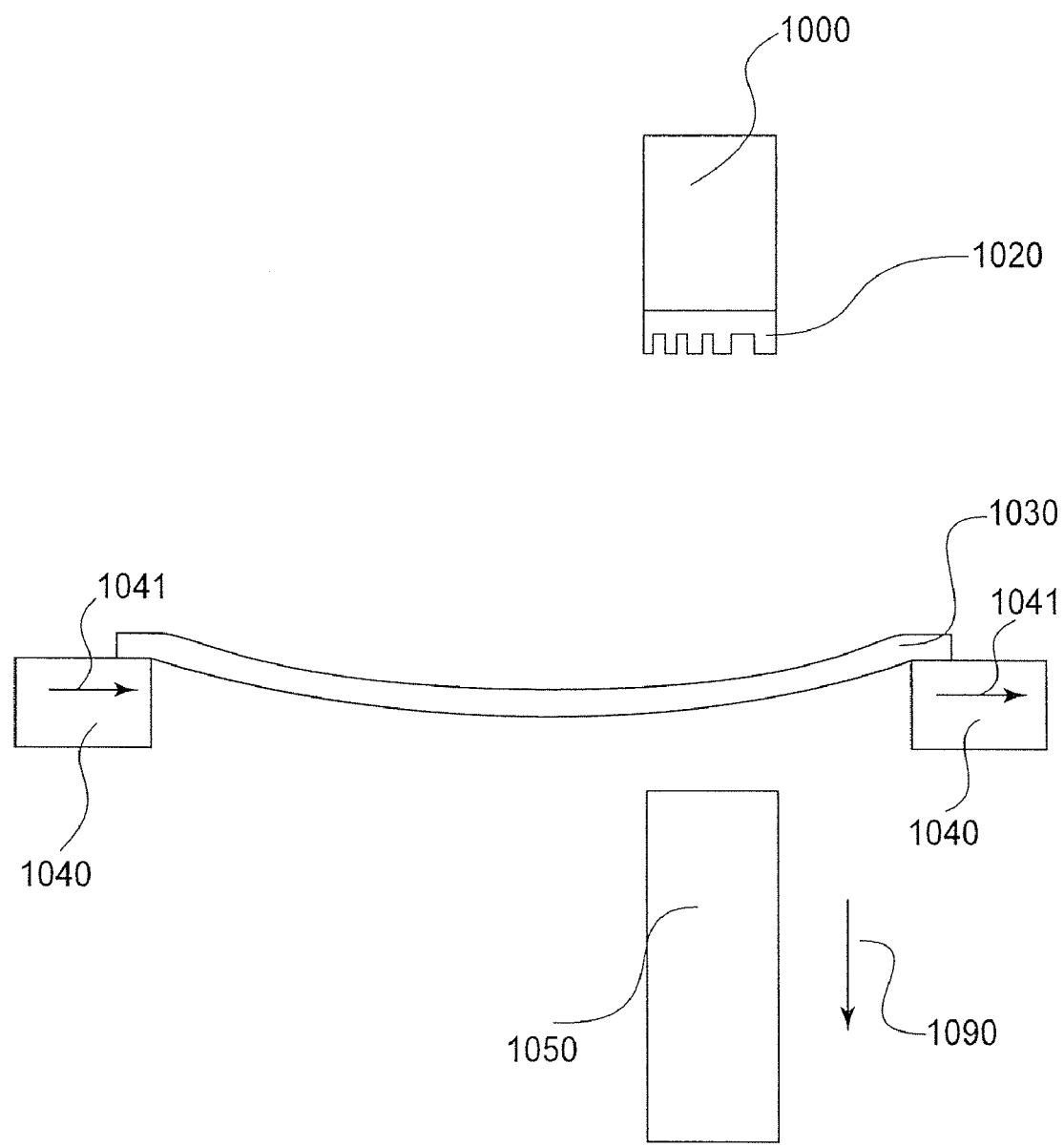
FIG. 1 is a schematic view illustrating an embodiment of the present invention.

An imprint apparatus (hereinafter also referred to as a pattern transfer apparatus or a processing apparatus) according to this embodiment includes, as shown in FIG. 1, a first holding portion 1000 for holding a mold 1020, a second holding portion 1040 for holding a processing member (member to be processed) 1030, and a support portion 1050 for partially supporting the processing member 1030 at a position opposite (via the processing member 1030) to the mold 1020 held by the first holding portion 1000.

The second holding portion 1040 is movable in a first direction (indicated by an arrow 1041). In a preferred embodiment, the second holding portion is also movable in a direction opposite to the first direction (the arrow 1041 direction) when the second holding portion 1040 is movable in a direction parallel to the first direction. As described above, the second holding portion 1040 is movable in the first direction 1041, so that the support portion 1050 is capable of linearly changing a position for supporting the processing member 1030. In the case in which a transfer area of a pattern capable of being formed with the mold is smaller in size than the processing member, a plurality of transfer steps is performed while shifting the pattern transfer area. This method is called a step-and-repeat method. The pattern transfer apparatus of this embodiment is suitably used in this method.

The second holding portion 1040 may preferably be movable also in a direction, e.g., perpendicular to the plane of the figure in addition to the above-described first direction so that the support portion 1050 can change a supporting position for supporting the processing member in a planar direction. In other words, the second holding portion may preferably have a mechanism movable in a direction parallel to a plane constituted by mutually orthogonal two axes (e.g., the X-axis and the Y-axis).

In the pattern transfer apparatus of this embodiment, the support portion 1050 and the second holding portion 1040 are moved relative to each other in a second direction 1090 perpendicular to the first direction 1040 so that the support portion 1050 and the processing member 1030 are moved away from each other from a contact state (not shown) therebetween. The above-described movable mechanism can be realized by moving the support portion 1050 in the second direction 1090 or moving the second holding portion in a direction opposite to the second direction 1090 so that the support portion 1050 is moved relative to the second holding portion 1040 in the second direction. It is also possible to provide a mechanism movable in a direction parallel to the second direction to both of the support portion 1050 and the second holding portion 1040. The support portion 1050 and the second holding portion 1040 may preferably be operable independent of an operation of the first holding portion 1000. The relative operation of the second holding portion with the support portion may preferably be a translation operation in one direction, not oscillation.

Figure 15:
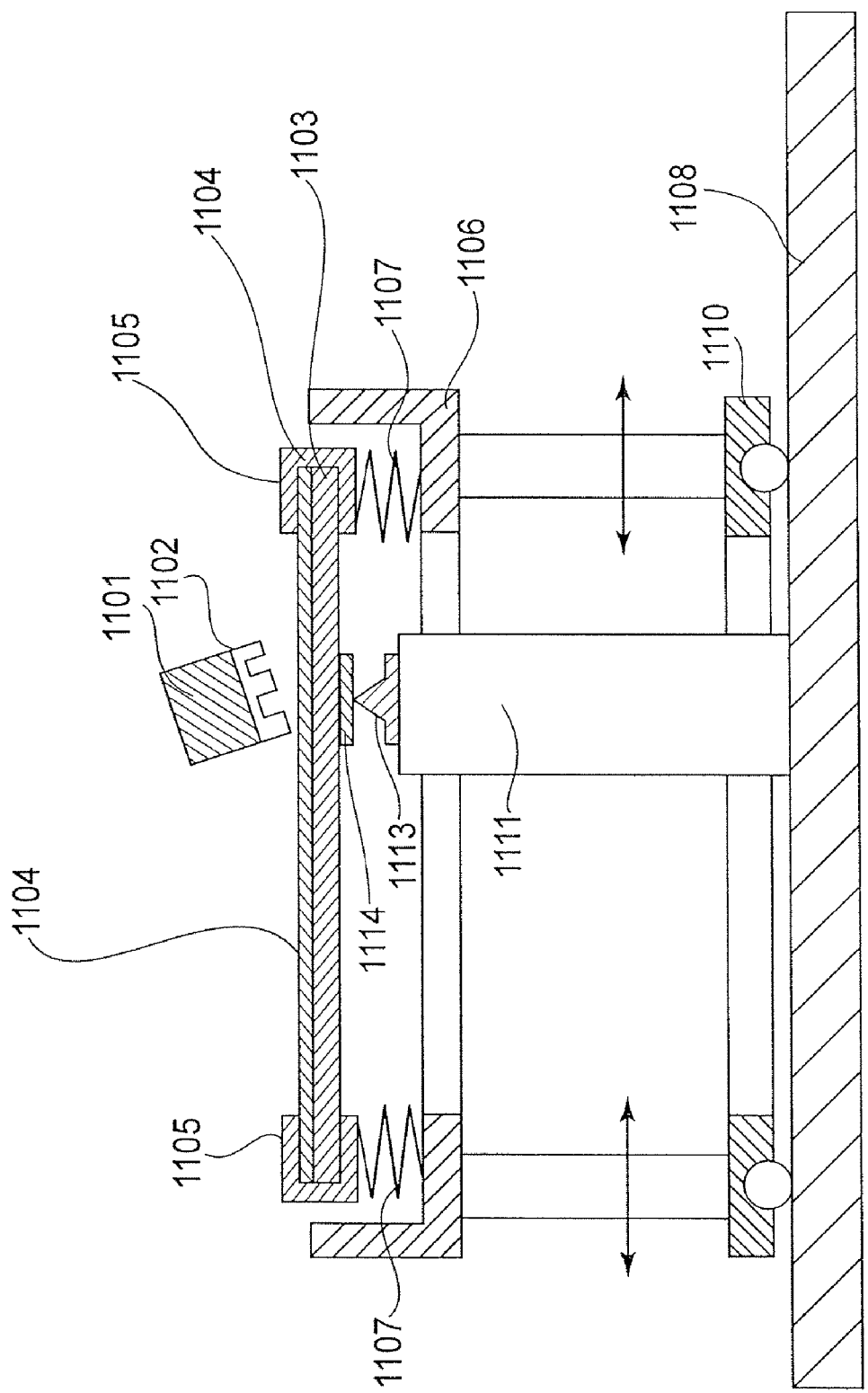
FIG. 15 is a schematic view illustrating an embodiment of a conventional imprint apparatus.

As described above, by constituting the apparatus so that the support portion is movable away from the processing member, e.g., in the case where an operation for changing the supporting position of the processing member by the support portion in such a state that the processing member is bent, as shown in FIG. 1, it is possible to obviate friction of the surface of the processing member with the support portion. In the above-described mechanism proposed in JP-A No. 2003-77867, as shown in FIG. 15, the support portion 1111 is fixed, so that there is a possibility that the back surface of the processing member is damaged or broken during movement of the processing member by the moving mechanism 1110 in a direction of a double pointed arrow.

Accordingly, in the apparatus according to this embodiment, in the case where the processing member is bent, it is preferable that the support portion is moved away from the processing member so as not to contact the processing member even when the support portion is moved to a position immediately below a position of the processing member where an amount of bending is maximum.

Incidentally, in FIG. 1, the processing member 1030 and the mold 1020 are shown, but these members are not required for the pattern transfer apparatus of the present invention in this embodiment. Further, the bending state of the processing member 1030 is exaggeratedly shown, but the pattern transfer apparatus of this embodiment is applicable irrespective of the bending state of the processing member.

Further, in such a state that the processing member is partially supported by the support portion, the apparatus can be operated to decrease the distance between the processing member and the pattern of the mold. Alternatively, in such a state that the processing member and the pattern of the mold are caused to contact each other, the apparatus can be operated to decrease the distance between the processing member and the support portion.

Further, the support portion and the second holding portion may preferably be operated relative to each other by an operation distance, independently of the first holding portion, in a direction parallel to the second direction so that the support portion and the processing member contact each other. In this case, the operation distance is variable depending on the support position, relative to the second holding portion, of the support portion. Here, the support position is, e.g., a position determined by a position control circuit 6114 using XY moving mechanism 6104 shown in FIG. 8. Further, the operation distance is variable depending on positional information about the member to be processed in the second direction. Here, the positional information is, e.g., information about a position of the processing member (strictly the pattern transfer area) in a Z-axis direction as in the case of a distance detection mechanism 6401 shown in FIG. 11.

Hereinafter, members or means capable of being added to the pattern transfer apparatus of this embodiment and the imprint lithography will be described in detail.

A: First Holding Portion

Figure 3:
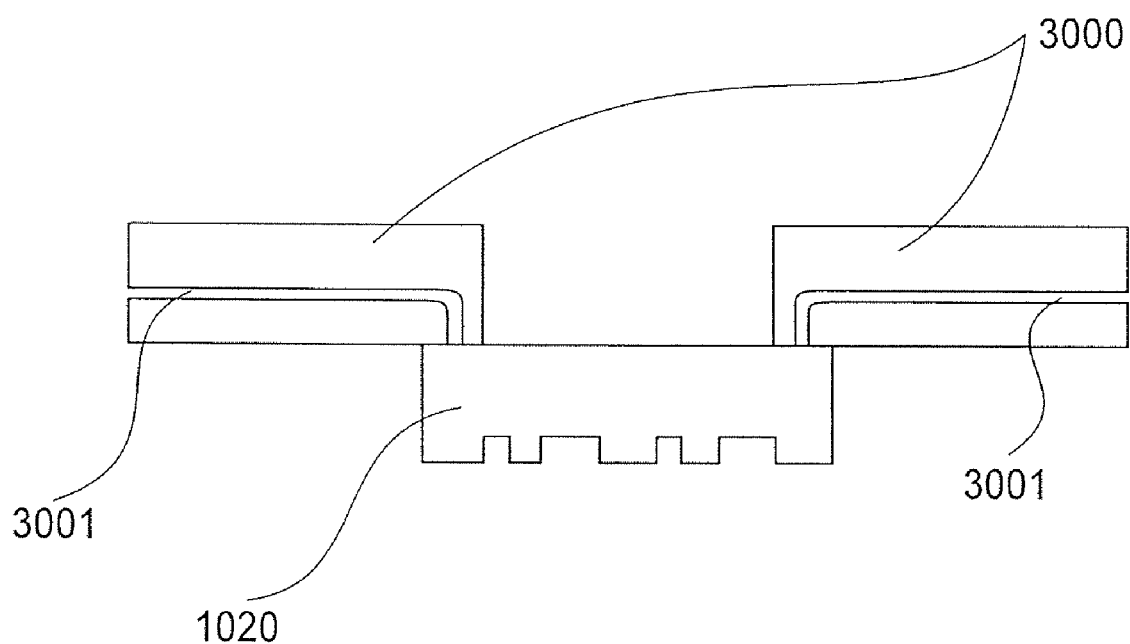
FIG. 3 is a schematic view illustrating a first holding portion in an embodiment of the present invention.

The shape of the first holding portion 1000 is not limited to that shown in FIG. 1, so long as the first holding portion 1000 can hold the mold and permit transfer of the pattern onto the processing member. For example, the first holding portion 1000 may be a mold holding portion 3000 as shown in FIG. 3. The mold holding portion 3000 is provided with grooves for vacuum adsorption and is configured to adsorb the mold 1020 in a vacuum by reducing pressure in the grooves. In the case of light imprinting such that the mold 3020 is irradiated with light, such as ultraviolet rays from a side of a surface opposite to a surface, of the mold 3020, on which an imprinted pattern is formed, thereby to cure a resin on a surface of the processing member, as shown in FIG. 3, the mold holding portion may preferably be configured so as not to block the irradiated light. It is also possible to realize the first holding portion having a shape as shown in FIG. 1 by using glass, such as quartz, which is capable of light irradiation. The first holding portion may be constituted by a material including a metal, such as aluminum or stainless steel or glass such as quartz, so long as the first holding portion can hold the mold by vacuum adsorption or an electrostatic chuck. As the first holding portion, a mold holding portion, shown in FIG. 49A of U.S. Pat. No. 6,696,220 or a mold holding portion, shown in FIG. 51A, for holding a mold in such a state that the mold itself is deformable by using a piezoelectric element, can be also applied.

Further, the first holding portion may preferably be movable in a direction parallel to the second direction 1090 (in the parallel direction identical or opposite to the second direction). The first holding portion can also be constituted so that it is movable in a direction parallel to the first direction 1041 (the parallel direction identical or opposite to the first direction).

Incidentally, independent of the operation of the first holding portion 1000 in the direction parallel to the second direction 1091, the second holding portion 1040 and/or the support portion 1050 may preferably be constituted so that they can move in a direction parallel to the second direction. In other words, independent of the moving operation of the mold in the direction parallel to the second direction, it is preferable that the operation of movement of the support portion away from the processing member is realized.

B: Second Holding Portion

The second holding portion shown in FIG. 1 has a function of holding the processing member. The holding of the processing member can be realized by physically sandwiching the processing member or through an electrostatic chuck or vacuum adsorption.

In the case wherein the processing member is a flat plate-like member, it is held so as to be bent in a direction of gradation (gravity) in some cases. For this purpose, the second holding portion 1040 holds the processing member so as not to contact the processing member at a central area of the flat plate-like member in an in-plane direction or holds the processing member in the central area, of the flat plate-like member, in which the member is retracted compared with a peripheral area thereof.

The second holding portion 1040 may be provided in a plurality of separate positions, as shown in FIG. 2A or 2B, or as an integral (single) position, as shown in FIG. 2C.

A specific constitution of the second holding portion is illustrated in FIGS. 2A to 2D. Upper portions in FIGS. 2A to 2C are shown in such a manner that an in plane downward direction is taken as a direction of gravitation (Z-axis direction) and the XY plane is taken as a direction perpendicular to the plane of the drawing. Lower portions in FIGS. 2A to 2C are shown in an in-plane XY direction.

FIG. 2A shows the case where a circular flat plate like member 1030 is held by separated two holding portions, and FIG. 2B shows the case where the circular flat plate-like member 1030 is held by four separated holding portions. Further, FIG. 2C shows the case where the circular flat plate-like member is held by an integral type annular ring-like holding portion. In these figures, portions under the plate-like member are indicated by dotted lines.

FIG. 2D is an enlarged view of the second holding portion 1030. As shown in FIG. 2D, it is possible to use a holding portion 1049, as desired, disposed so as not to move a back surface 1031 of the flat plate-like member 1030 away from the second holding portion 1040 from a contact state. In place of such a holding portion 1049, it is also possible to utilize an adsorption mechanism through the above-described electrostatic chuck or vacuum adsorption. Examples of a material constituting the second holding portion for holding the processing member may include silicon and those for the first holding portion described above.

Further, as a moving mechanism for moving the second holding portion 1040 in a direction parallel to a plane constituted by mutually orthogonal axes (e.g., X and Y axes), it is possible to appropriately select a linear motor or a feed screw.

The second holding portion 1040 can hold the processing member 1030, e.g., so that the processing member 1030 is bent in a direction parallel to the second direction 1090 described above. For this purpose, the second holding portion 1040 holds the processing member 1030 in a peripheral area of the processing member 1030 so that it does not contact the processing member in an in-plane central area.

The second direction 1090 is, e.g., the direction of gravitation.

An amount of bending of the processing member may be adjusted by moving the support portion 1090 and the second holding portion 1040 relative to each other in the second direction.

C: Support Portion

Hereinbelow, the support portion 1050 will be described by taking a surface of the flat plate-like processing member (such as a silicon wafer optionally provided with a minute surface unevenness) close to the mold as a front surface and taking a surface of the flat plate-like processing member close to the support portion as a back surface.

The support portion 1050 for supporting the processing member 1030 at a position opposite to the mold 1020 is characterized in that it partially supports the back surface of the processing member. More specifically, the support portion in this embodiment is not in contact with the entire back surface of the processing member, but contacts the processing member partially or locally at a part of the entire back surface. Incidentally, when the processing member is supported by a stage having a support surface equal to or larger than the area size of the processing member back surface, it is possible to provide minute holes in the stage in order to adsorb the processing member. In such a case, at portions of the minute holes, the processing member and the stage itself are not in contact with each other. In this case, however, the processing member is substantially supported by the stage at the entire back surface of the processing member.

During pattern transfer, in order to make uniform a distribution of a pressure applied to a pattern transfer surface of the processing member by the mold and the support portion, it is preferable that the support portion does not support the entire back surface of the processing member, but supports the processing member partially at a position opposite to the mold via the processing member. Although details will be described in Embodiments appearing hereinafter, particularly, it is preferable that at least one area of a surface of the first holding portion contacting the mold and a surface of the support portion contacting the processing member is smaller than an area of a processing surface of the mold and an area of a pattern forming surface of the processing member. In a more preferable embodiment, the surface of the first holding portion contacting the mold and the surface of the support portion contacting the processing member have a plane symmetry relationship. In other words, the mold and the processing member may suitably be pressed by members having the same cross-sectional shape.

Figure 7:
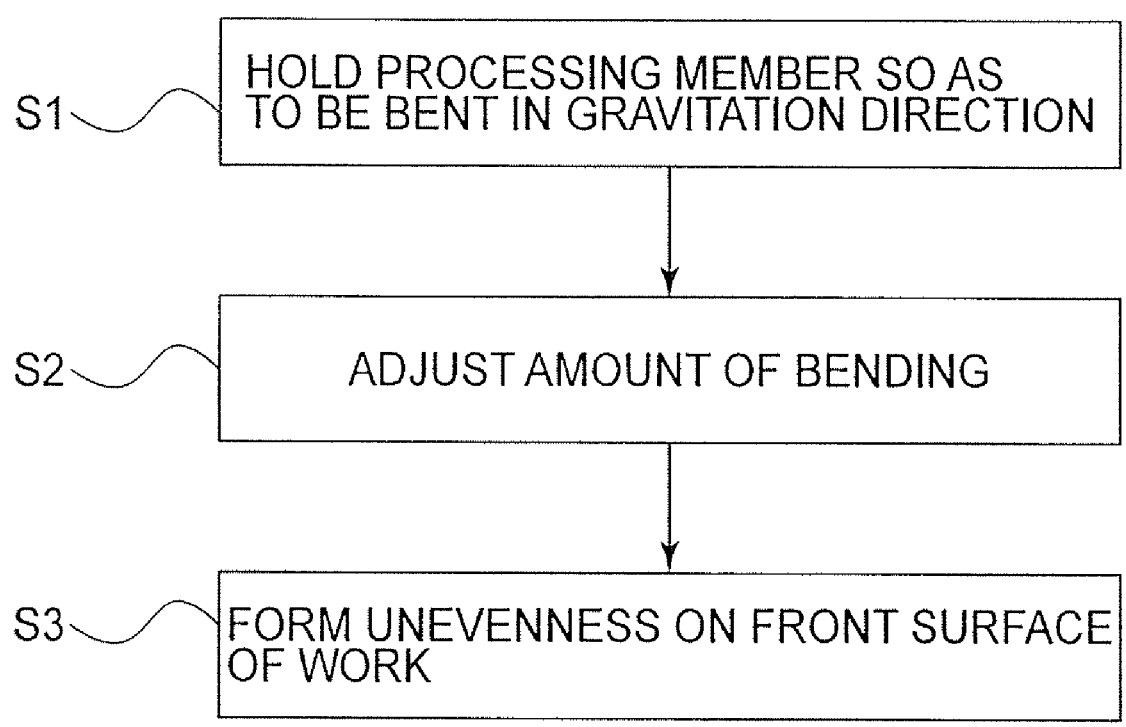
FIG. 7 is a flow chart illustrating an embodiment of the present invention.

The support portion 1050 can be constituted so as to be movable in the second direction 1090 shown in FIG. 7 and a direction opposite to the second direction. The second direction may, e.g., be the direction of gravitation. The operation of the support portion 1050 may suitably be a translation operation. For example, this can be realized by providing the support portion 1050 with an actuator vertically movable in the second direction.

Further, the processing member 1030 and the support portion may also be constituted so as to directly contact each other or indirectly contact each other via a different member interposed therebetween. For example, as described in JP-A No. 2003-77867, as the different member, it is possible to use the inclination adjusting mechanism utilizing the pivot (rotation axis).

Figure 4:
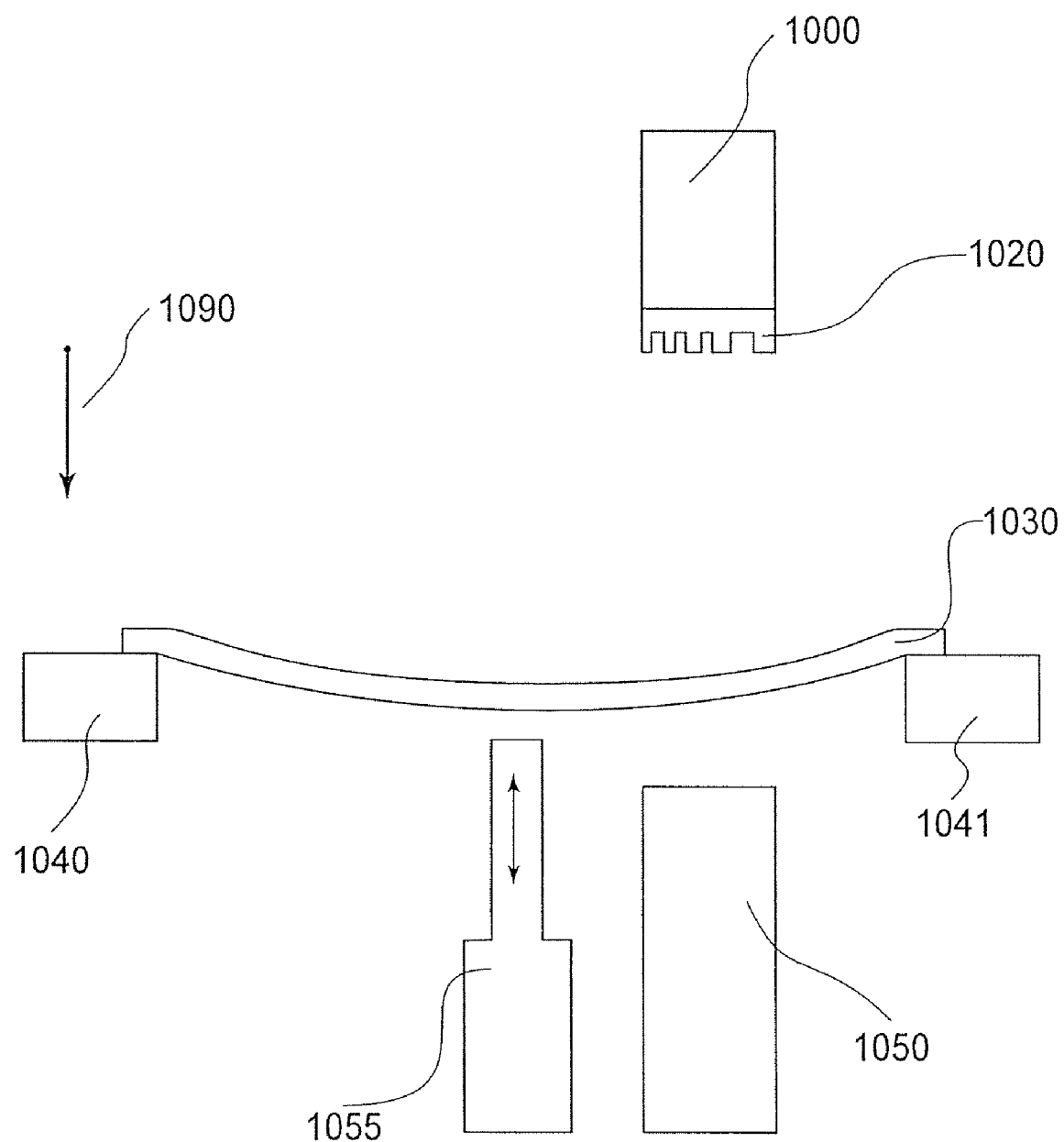
FIG. 4 is a schematic view illustrating an embodiment of the present invention.

Further, in this embodiment, in order to decrease a bending amount (amount of bending) in a certain direction (e.g., the direction of gravitation), the second holding portion 1040 and the support portion 1050 can be constituted so as to change a distance therebetween in the certain direction. When the bending amount can be adjusted, as shown in FIG. 4, it is possible to separately dispose the support portion 1050 for supporting the processing member 1030 and a bending amount adjusting portion 1055.

In FIG. 3, the bending amount adjusting portion 1055 is constituted so as to be movable in the second direction (e.g., the gravitation direction) and a direction opposite to the second direction. Imprinting is performed in such a manner that the bending amount of the processing member 1030 in the second direction is decreased by the bending amount adjusting portion 1055, and then a distance between the support portion 1050 and the mold 1020 is decreased while interposing the processing member 1030 between the support portion 1050 and the mold 1020. For example, in such a state that the bending amount of the processing member 1030 is made substantially zero by the bending amount adjusting portion 1055, the support portion 1050 is moved in the direction opposite to the gravitation direction to contact the back surface of the processing member 1030. Thereafter, the mold holding portion 1000 is moved downward in the gravitation direction to effect the imprinting.

Incidentally, in the case of adjusting the bending amount with the support portion 1050 or the bending amount adjusting portion 1055, the imprinting may also be preferably effected in such a state that a force is applied to the processing member 1030 by the support portion 1050, or the like, so that the processing member 1030 is bent in a direction opposite to the gravitation direction. Such a state is, e.g., a state in which the flat plate-like processing member is bent convexly upward in the opposite direction to the gravitation direction in the central area of the processing member and in the neighborhood thereof (not shown).

In the case of ensuring such a state, as shown in FIG. 2D, the flat plate-like member may preferably be pressed against the second holding portion 1040 or held with a chuck so as not to be moved away from the second holding portion 1040.

The imprinting performed in the state of the bending of the processing member in the direction opposite to the gravitation direction has the following advantage.

More specifically, during the contact of the mold with the processing member, the flat plate-like member minutely fluctuates or oscillates in the gravitation direction to cause repetition of contact and noncontact between the support portion and the processing member in some cases. There is a possibility that this minute fluctuation causes a deviation of an imprint position or an unnecessary deformation of a resin, or the like, constituting the processing member. On the other hand, in some cases, it is possible to suppress an occurrence of the minute fluctuation by effecting the imprinting in the bending state of the processing member in the opposite direction to the gravitation direction, i.e., in such a state that the contact of the support portion or the bending amount adjusting portion with the flat plate-like processing member is continuously kept.

In the apparatus in this embodiment, in the state in which the processing member is partially supported by the support portion, such an operation that a distance between the processing member and the imprinted pattern of the mold is decreased may preferably be performed. As a result, the imprinted pattern and the processing member are caused to contact each other.

Such a constitution that the support portion 1050 is movable in the second direction 1090, and the second holding portion 1040 is not movable in the second direction 1090, is also preferred. For example, it is preferable that the support portion 1050 is movable only in a direction parallel to the gravitation direction and the second holding portion 1040 is movable only in a direction perpendicular to the gravitation direction.

The support portion 1050 can be configured to be movable in the gravitation direction and in the opposite direction to the gravitation direction. The support portion 1050 may also support the processing member through the inclination adjusting mechanism (pivot mechanism) as described above. It is also possible to move the support portion 1050 in the first direction 1041 instead of the movement of the second holding portion 1040 for holding the processing member 1030 in the first direction 1041.

D: Mold (Template)

The mold used in this embodiment has an imprinted pattern at its surface. The imprinted pattern may be realized by forming a recessed portion and a projection portion on the mold itself or by providing a different member constituting a projection portion at an upper surface of the mold. In the former case, the imprinted portion (recessed and projection portions) of the mold is transferred onto the processing member. In the latter case, a recessed portion is formed on the processing member by the different member or the different member itself is transferred onto the processing member. For example, as the latter case, there is a case where a predetermined pattern formed at a planar surface of the mold with ink is transferred onto the upper surface of the processing member, like a seal impression (also called "soft imprinting").

The pattern constituting material may also be those in the form of a liquid, a solid, a gel, etc., in addition to ink.

It is also possible to cause the processing member and the mold to indirectly contact each other via a release agent after the release agent is applied onto the imprinted pattern of the mold.

The mold may be formed of a material including glass, such as quartz, metal, silicon, etc. The imprinted pattern may, e.g., be formed through electron beam lithography.

E: Member to be Processed (Processing Member)

The processing member is also called a work in some cases.

Examples of the processing member may include a semiconductor substrate such as an Si substrate or a GaAs substrate, a resinous substrate, a quartz substrate, or a glass substrate. Further, as the processing member, it is also possible to use members comprising these substrates coated with resin. It is also possible to use a multi-layer substrate prepared in such a manner that a thin film is caused to grow on these substrates or bonded to these substrates. It is also possible to employ a light transmissive quartz substrate.

The resin applied onto the substrate is cured by irradiating the substrate with, e.g., ultraviolet rays from the mold side. Examples of such a photocurable resin may include those of urethane-type, epoxy-type, and acrylic-type.

Further, as the resin, it is also possible to use a thermosetting resin, such as a phenolic resin, an epoxy resin, a silicon resin, or polyimide, and a thermoplastic resin such as polymethyl methacrylate (PMMA), polycarbonate (PC), polyethylene terephthalate (PET), or acrylic resin. By using these resins, the pattern is transferred through heat treatment as desired.

In the case where the processing member is constituted without containing the resin, the processing member is physically deformed only by a pressing force.

As described above, in FIG. 1, the case where the processing member is bent convexly downward at the central area thereof in the second direction 1090 (indicated by the downward arrow) is shown. For example, in the case where a wafer as the processing member is bent in the gravitation direction by its own weight, such a state as shown in FIG. 1, is created. In FIG. 1, a degree of bending is exaggeratedly shown. In this embodiment, the present invention is applicable to not only the processing member bent in the second direction, but also, a processing member which is not bent. Further, the flat plate-like processing member, such as a silicon wafer, is deformed in some cases through a process such as a heating step or an ion implantation step. The present invention according to this embodiment is also applicable to such a processing member bent due to the deformation.

In the apparatus of this embodiment, the flat plate-like processing member may be disposed so that a direction of a normal to the flat plate-like processing member is not only parallel to the gravitation direction, but also, perpendicular to the gravitation direction.

F: Optional Parts

As described above, the apparatus according to this embodiment may be provided with the bending amount adjusting portion (1055 shown in FIG. 4) for moving the processing member adjusting portion (1055 shown in FIG. 4) for moving the processing member upward in the direction opposite to the gravitation direction so that the bending amount of the processing member in the gravitation direction is decreased.

Figure 8:
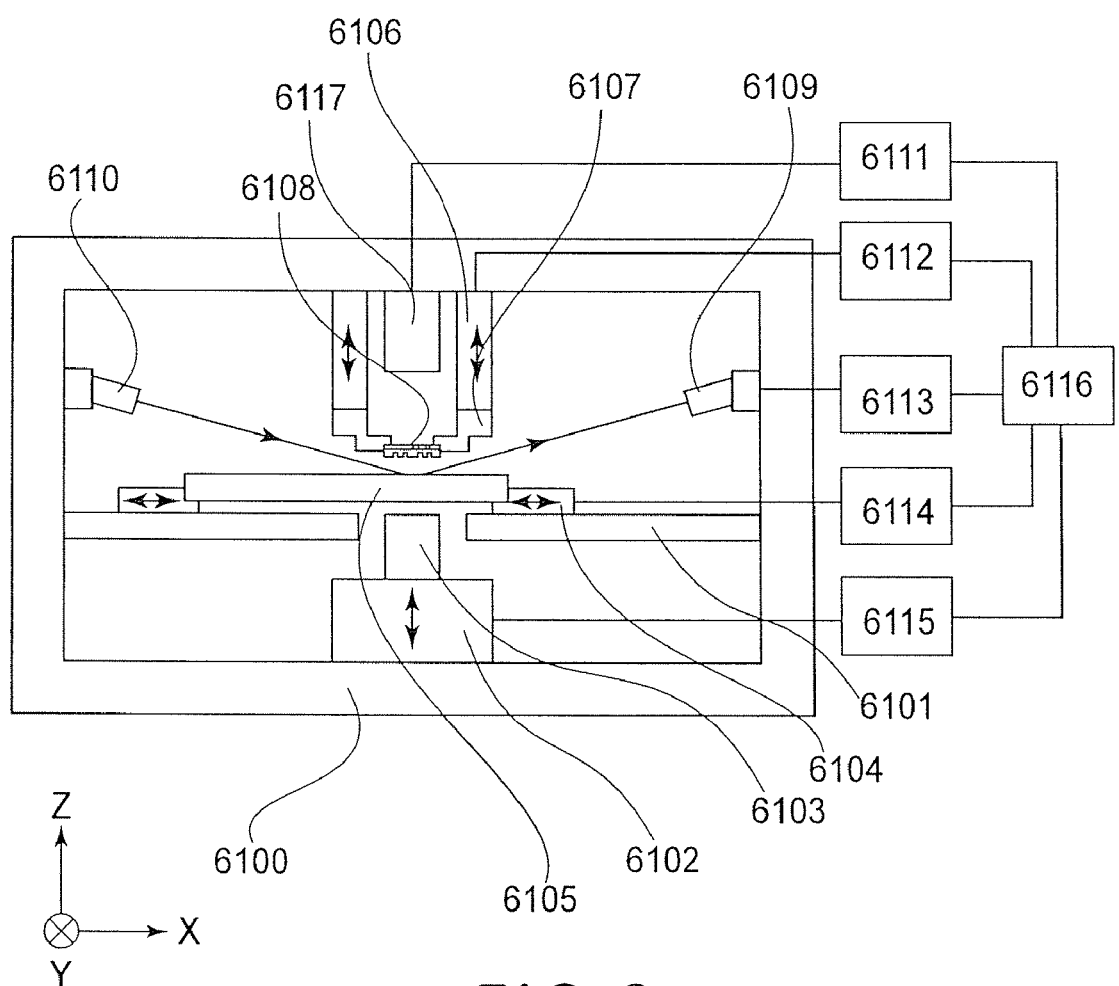
FIGS. 8 to 14 are schematic views each illustrating an embodiment of the present invention.

Further, the apparatus may also be provided with an angle detection portion, e.g., constituted by an angle detecting mechanism 6109 and a laser 6110 shown in FIG. 8, for detecting an inclination angle of a surface of the processing member onto which a pattern is transferred. The apparatus may further be provided with a load detection portion, e.g., constituted by a load detecting mechanism 6201 shown in FIG. 9, for detecting a force received by the support portion as a load. The apparatus may further be provided with a distance measurement portion, e.g., constituted by a distance measuring mechanism 6401 shown in FIG. 11, for measuring a distance from the mold to the processing member.

These additional parts will be described more specifically in Embodiments appearing hereinafter.

G: Imprint Lithography

FIGS. 5A to 5E show an example of the imprint lithography, which can be performed by using the apparatus according to this embodiment. In these figures, a light imprinting method for curing a resin through irradiation with light is shown, but other imprinting methods for curing a resin under heating or by a combination of light and heat may also be applicable to the apparatus of this embodiment.

Figure 5A:
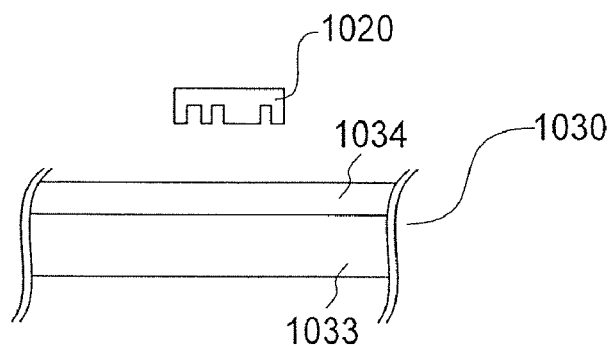
FIGS. 5A to 5E are schematic views illustrating steps of imprint lithography according to an embodiment of the present invention.

First, as shown in FIG. 5A, a mold 1020 and a processing member 1030 comprising a silicon substrate 1033 and a photocurable resin 1034 applied onto the silicon substrate 1033 are disposed opposite to each other.

Figure 5B:
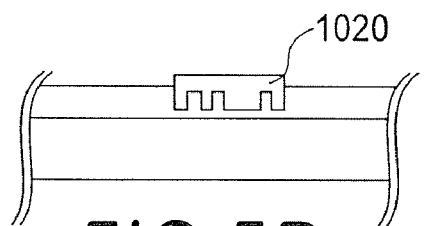

Next, as shown in FIG. 5B, the mold 1020 and the resin 1034 contact each other. At this time, the mold side, the processing member side, or both sides, may move so that they contact each other. It causes a pressure to be applied to both sides. Thereby, a shape of the resin is changed into the shape reflecting on an imprinting pattern of the mold.

Figure 5C:
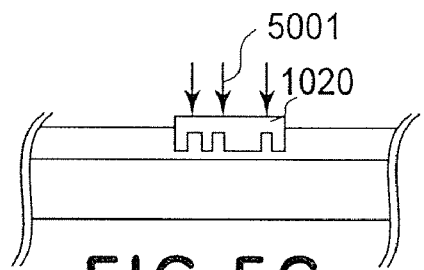
Figure 5D:
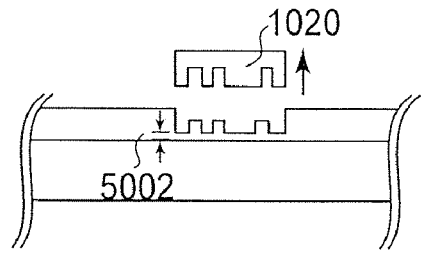

Next, as shown in FIG. 5C, irradiation with UV light 5001 is effected from a back side of the mold 1030 to cure the resin 1034. Thereafter, the mold and the resin are separated from each other as shown in FIG. 5D. In this case, as desired, by moving the mold or the processing member relative to each other, a so-called step-and-repeat method, such that pattern transfer is repetitively performed in an area adjacent to the pattern transferred area, is effected.

Figure 5E:
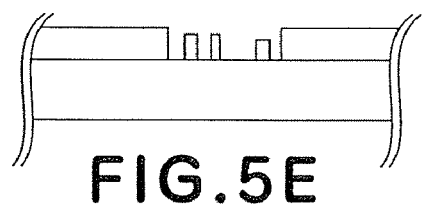

In the case wherein there is a residual film 5002 of the resin, the residual film 5002 is removed by ashing (e.g., by oxygen RIE (reactive ion etching)), as desired. As a result, as shown in FIG. 5E, the pattern of the mold is transferred onto the processing member.

Then, the substrate 1033 is etched by using the transferred pattern constituted by the resin 1034 as a mask (not shown).

In the case of using a resin having a low viscosity, it is possible to effect the pattern transfer by sufficiently lowering the pressure applied to the resin by the mold, although a degree of pressure application varies depending on the viscosity of the resin.

The above-described members, or method A to G in the First Embodiment, may also be applicable to all the embodiments of the present invention. Further, the entire disclosures of U.S. Pat. Nos. 6,696,220; 6,719,915; 6,334,960; and 5,772,905 and U.S. patent application Ser. No. 10/221,331, which corresponds to U.S. Patent Application Publication No. 2003/0170053, are expressly incorporated herein by reference. For example, U.S. patent application Ser. No. 10/221,331 discloses such a supporting manner that the processing member is not supported partially, but is supported at an entire back surface of the processing member. However, a movable mechanism, a processing member, and a holding mechanism at a mold (stamp) holding portion are applicable to the present invention.

Incidentally, the imprint apparatus in the present invention is applicable to transfer an imprinted pattern, particularly on the order of nanometers to micrometers. For example, the imprint apparatus may suitably be used for forming a pattern with a spacing of several nanometers to several hundreds of nanometers.

Second Embodiment

Imprint Apparatus

An apparatus according to this embodiment relative to an imprint apparatus for forming an imprinted pattern on a processing member with a pattern provided at a processing surface of a mold.

More specifically, the apparatus includes a first holding portion for holding the mold, a second holding portion for holding the processing member, and a support portion for partially supporting the processing member at a position opposite to the mold held by the first holding portion.

The second holding portion is movable in a direction parallel to the processing surface so that a position for supporting the processing member by the support portion is changed. Further, the apparatus is characterized in that the support portion and the second holding portion are movable relative to each other in a direction perpendicular to the processing surface so that the support portion is moved away from the processing member held by the second holding portion.

In the apparatus according to this embodiment, operational directions of the support portion and the second holding portion are specified on the basis of the processing surface of the mold. Also, in the apparatus in the First Embodiment, the processing surface of the mold and the moving direction (the first direction) of the second holding portion are substantially parallel to each other, so that the technical constitutions described in the First Embodiment are applicable to the apparatus of this embodiment as they are.

Further, the support portion and the second holding portion may preferably be operated relative to each other by an operation distance, independently of the first holding portion, in a direction perpendicular to the processing surface so that the support portion and the processing member contact each other. In this case, the operation distance may preferably be variable depending on the support position, relative to the second holding portion, of the support portion. Further, the operation distance may also preferably be variable depending on positional information about the member to be processed in the second direction.

Third Embodiment

Imprint Apparatus

An apparatus according to this embodiment relates to an imprint apparatus for forming an imprinted pattern on a processing member with a pattern provided to a mold.

More specifically, the apparatus includes a first holding portion for holding the mold, a second holding portion for holding the processing member, and a support portion for partially supporting the processing member at a position opposite to the mold.

A pressing axis for pressing (pressurizing) the processing member is determined by the mold held by the first holding portion and the support portion. In the case shown in FIG. 1, the pressing axis is an axis along a direction in which the mold 1020 and the support portion are disposed opposite to each other via the processing member.

The apparatus of this embodiment is characterized in that the support portion and the second holding portion are movable relative to each other in a direction parallel to the pressing axis so that the support portion is moved away from the processing member held by the second holding portion, so that it is possible to realize a pattern transfer apparatus capable of alleviating an influence due to bending of the processing member.

Incidentally, it is also preferable that the pattern transfer apparatus is constituted by fixing the pressing axis. More specifically, such a constitution that the first holding portion and the support portion are actuated only in the direction parallel to the pressing axis is suitable for nanoimprint lithography requiring a processing accuracy on the order of several nanometers to several tens of nanometers.

Further, the support portion and the second holding portion may preferably be operated relative to each other by an operation distance, independently of the first holding portion, in a direction parallel to the pressurizing axis so that the support portion and the processing member contact each other. In this case, the operation distance is variable depending on the support position, relative to the second holding portion, of the support portion. Further, the operation distance is variable depending on positional information about the member to be processed in the second direction.

Fourth Embodiment

Imprint Method

An imprint method according to this embodiment relates to an imprint method of forming an imprinted pattern on a processing member with a pattern provided to a mold.

More specifically, the imprint method is characterized in that the processing member, held so as to be capable of being bent by its own weight, is pushed up by a support portion movable in a direction opposite to the gravitation direction, thus decreasing a bending amount of the processing member in the gravitation direction to transfer the pattern of the mold onto the processing member.

The decrease in bending amount of the processing member in the gravitation direction at least includes the following three cases.

A first case is the case in which the bending amount of the processing member bent convexly downwardly in the gravitation direction is decreased down to zero or close to zero. A second case is the case in which the bending amount of the processing member bent convexly downwardly in the gravitation direction is decreased to a negative value so that the processing member is bent convexly upwardly in a direction opposite to the gravitation direction. A third case is the case in which the processing member bent convexly upwardly in the direction opposite to the gravitation direction is further bent convexly upwardly in the direction opposite to the gravitation direction so as to increase an absolute value of the negative bending amount.

In this embodiment, although the gravitation direction is taken as a basis of the direction of bending, the above-described three cases for the decrease in bending amount of the processing member in the gravitation direction are similarly applicable to the Fifth Embodiment described hereinafter.

According to this embodiment, in such a state that the processing member is bent by its own weight as it is, it is possible to cause a pressure distribution in a transfer area of a pattern formed by imprinting to come closer to a uniform distribution. Further, it is also possible to alleviate an irregularity in shape of a plurality of pattern transfer areas formed in the case of effecting imprinting of the processing member plural times by using the above-described step-and-repeat method.

The above-described pushing up of the processing member by the support portion may preferably be performed so that a portion of the processing member contacting the mold in an in-plane area of the processing member is parallel to the processing surface of the mold provided with the pattern.

The pattern transfer method according to this embodiment will be described with reference to FIG. 6, wherein an arrow 8 represents the gravitation display.

Figure 6A:
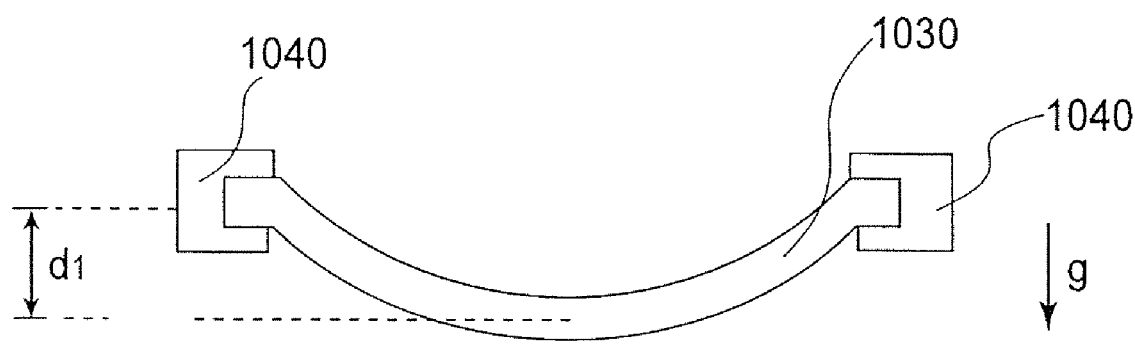
FIGS. 6A to 6C are schematic views illustrating an embodiment of the present invention.
Figure 6B:
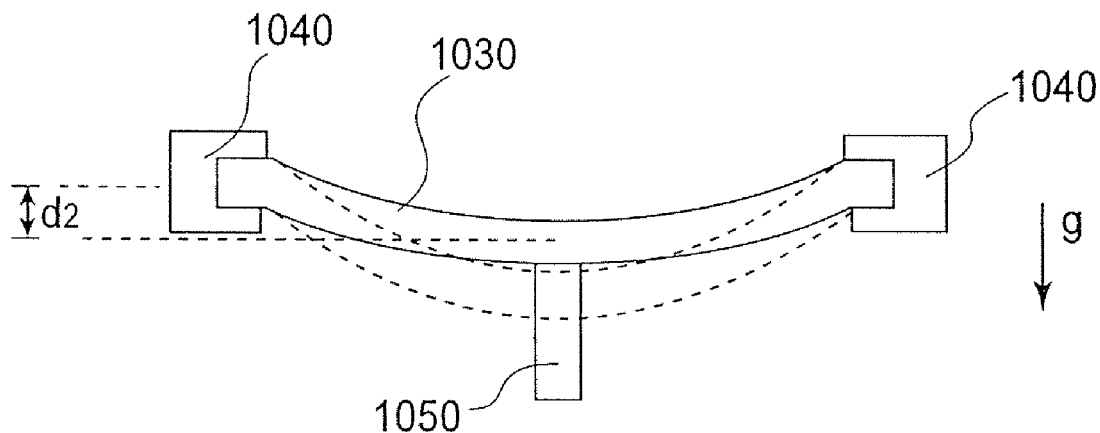

As shown in FIG. 6A, a back surface of a flat plate-like processing member 1030, held to be bent in the gravitation direction, is pushed up in a direction opposite to the gravitation direction to decrease a bending amount of the processing member 1030 in the gravitation direction. In FIG. 6B, a dotted line represents an original state of the processing member 1030 bent by its own weight (as shown also in FIG. 1) and a solid line represents a state in which the bending amount of the processing member 1030 is decreased, i.e., a state in which the bending amount is corrected or adjusted. In FIG. 6B, the bending amount is decreased by causing a support portion 1050 to perform a translation operation in the direction opposite to the gravitation direction. In FIG. 6B, a conceptual view macroscopically showing the processing member is illustrated and in the case where the processing member is viewed microscopically, e.g., there is also a possibility that the processing member is bent convexly upwardly in an area immediately on the support portion 1050 even when the bending amount of the processing member is decreased as a whole.

Figure 6C:
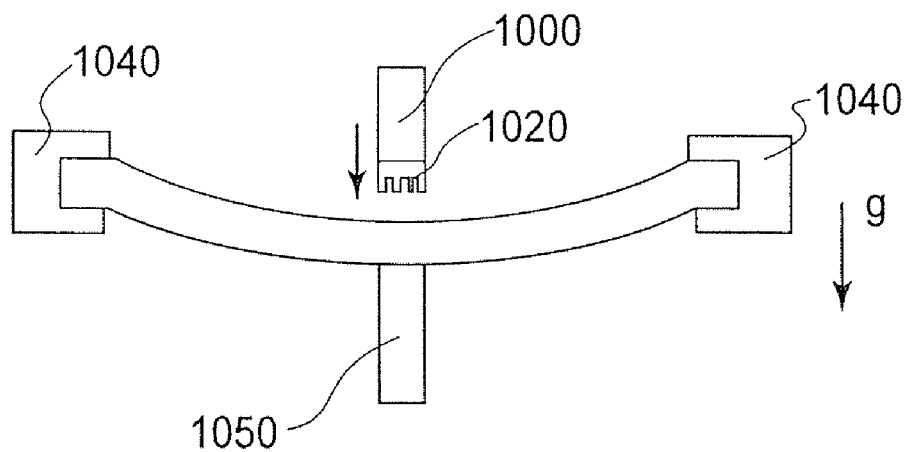

Then, as shown in FIG. 6C, imprinting with a mold 1020 held by a first holding portion 1000 and having an imprinted pattern is effected at the front surface of the processing member 1030 to transfer the imprinted pattern onto the front surface of the processing member 1030.

The adjustment of the bending amount may be performed by utilizing either one of or both of the support portion 1050 and a second holding portion 1040.

As shown in FIGS. 6A and 6B, the imprinting is effected in such a state that the bending amount is decreased from d1 to d2, so that it is possible to decrease an irregularity in pressing force due to the influence of the bending of the processing member.

Here, d1 represents a bending amount in the gravitation direction in the case of holding the processing member 1030 by the second holding portion 1040. On the other hand, d2 may preferably be substantially zero, i.e., the processing member 1030 may preferably be supported at a position wherein the processing member 1030 does not cause the bending by its own weight.

Incidentally, when the bending amount has an absolute value smaller than d1, the imprinting can also be effected in a state in which the processing member 1030 is bent in the direction opposite to the gravitation direction.

Further, when the imprinting is effected in a state in which the bending amount of the processing member 1030 in an imprint area is always adjusted to d2, i.e., a pressing position in Z-axis direction is adjusted, the following effect is achieved.

More specifically, it is possible to suppress an irregularity in pressing force at each of respective portions during the imprinting at a plurality of portions.

Further, it is preferable that the order of contact of the processing member 1030, the support portion 1050, and the mold 1020 is as follows.

First, the support portion 1050 and the back surface (opposite from the front surface subjected to the imprinting) of the flat plate like member 1030 contact each other and thereafter, the mold 1020 and the flat plate-like member 1030 or the resin on the flat plate-like member 1030 contact each other. However, the present invention is not limited thereto.

In the imprinting described with reference to FIG. 15, there is such a case that a pressure distribution in an in-plane direction of the processing member is caused to occur even in a single imprint area (corresponding to a size of the mold). This is because a rotational force with respect to the processing member is generated with a first contact portion between the mold and the processing member as a fulcrum. More specifically, this is because there is a possibility of an occurrence of a distribution of pressure applied to the resin with respect to the fulcrum and a portion apart from the fulcrum. The pressure distribution means that an irregularity in residual film thickness is caused to occur in the resin onto which the imprinted pattern of the mold is transferred. More specifically, in the constitution shown in FIG. 15, there is a possibility of an occurrence of a difference in residual film thickness of the resin even in the imprint area corresponding to the mold size. Here, the residual film thickness means a thickness of the resin remaining particularly between the projection portion, of the imprinted pattern of the mold, and the substrate.

According to the pattern transfer method of this embodiment, it is possible to decrease a degree of the above-described pressure distribution when the imprinting is effected in such a state that the bending amount d2 is made substantially zero while retaining a parallel state between the mold surface and the surface of the processing member.

Incidentally, as shown in FIG. 6C, it is possible to directly transfer the pattern onto the flat plate-like processing member by effecting the imprinting.

The processing member is prepared, e.g., by applying the resin on the entire surface of or partially on the surface of the substrate. In such a pressing state that the mold is pressed against the resin, the resin is cured by heating or irradiation with light such as ultraviolet rays, thus permitting pattern transfer.

During the heating or the irradiation with light such as ultraviolet rays, in order to hold the processing member, it is desirable that a positional relationship between the second holding portion 1040 and the mold 1020 (or the mold holding portion 1000) is controlled. Particularly, the resin may preferably be cured while controlling a relative position therebetween in an in-plane (XY plane) direction perpendicular to the gravitation direction. This is because the mold or the substrate causes positional deviation in the XY in-plane direction of the flat plate-like processing member in some cases due to curing of the resin by the heating or the irradiation with light.

Further, in the case where the imprinting at a plurality of portions in the in-plane direction of the flat plate-like processing member is effected by the step and repeat method, the imprinting may preferably be effected in the following manner.

In the case of changing the relative position in the in-plane direction between the processing member 1030 and the support portion 1040, after the state between the support portion and the back surface of the processing member is once changed from the contact state to a noncontact state, the relative position in the in-plane direction is changed. By doing so, e.g., it is possible to decrease a degree of damage or breakage of the processing member due to the contact of the support portion with the processing member and a degree of an occurrence of contamination by friction therebetween.

The pattern transfer method of this embodiment will be briefly described with reference to FIG. 7.

First, the processing member is held so that it is bent in the gravitation direction (S1).

Thereafter, a bending amount of the processing member is adjusted (S2).

After the bending amount is adjusted, an imprinted pattern is formed on a front surface of the processing member (S3).

As described above, in this embodiment, the case where the processing member is bent in the gravitation direction is described, but the constitution for adjusting the bending amount in the present invention is also applicable to a processing member, which is bent in a direction different from the gravitation direction.

Incidentally, the distance of pushing up by the support portion may preferably be changed depending on a support position, relative to the second holding portion, of the support portion. Further, the distance of pushing up by the support portion may also be preferably changed depending on positional information about the processing member in the gravitation direction.

Fifth Embodiment

Imprint Method

An imprint method according to this embodiment relates to an imprint method of forming an imprinted pattern on a processing member with a pattern provided at a processing surface of a mold.

More specifically, in the imprint method, the processing member is disposed between a first holding portion for holding the mold and a support portion disposed at a position opposite to the processing surface of the mold.

In a state in which the support portion is retracted so as not to contact the processing member, the processing member held by a second holding portion is moved in a direction parallel to the processing surface to determine a pattern transfer area.

Then, the support portion and the second holding portion are moved relative to each other in a direction perpendicular to the processing surface of the mold to cause the support portion and the processing member to contact each other (first contact).

Before or after the contact between the support portion and the processing member, the processing surface of the mold and the processing member are caused to contact each other (second contact).

Thereafter, the pattern provided at the processing surface of the mold is transferred onto the processing member.

As a result, it is possible to realize a pattern transfer method having decreased the influence due to bending of the processing member.

In this embodiment, the first contact and the second contact may be effected in any order or substantially at the same time. For example, after the pressing position is adjusted in a state of contact of the support portion with the processing member, at the adjusted pressing position, the processing surface of the mold and the processing member are caused to contact each other. Alternatively, after the processing surface of the mold and the processing member are caused to contact each other, the support portion and the processing member are caused to contact each other.

In such a state that not only the processing member and the support portion contact each other, but also the processing member and the processing surface of the mold contact each other, it is also possible to effect position adjustment for determining the pressing portion while retaining the contact state among these three members or portions. For example, in the state in which the processing member is bent in an in-plane direction, after the processing member is caused to contact the processing surface of the mold, it is possible to effect the positional adjustment so that the bending amount is decreased.

Incidentally, it is preferable that the support portion and the processing member are caused to contact each other by moving them relative to each other in a direction perpendicular to the processing surface depending on positional information about the pattern transfer area in the direction perpendicular to the processing surface.

Sixth Embodiment

Process for Producing a Chip

In this embodiment, examples of a chip may include an optical chip, a biochip such as μ-TAS, a semiconductor chip, etc.

In the process for producing the chip of this embodiment, a mold having a pattern and a processing member are prepared as described in the First to Fifth Embodiments.

Next, an imprinted pattern is formed on the processing member by using the imprint apparatus described in any of the First to Third Embodiments.

Incidentally, it is possible to effect a treatment such as etching or ion implantation by using the pattern formed on the processing member as a mask, as desired.

The processing member is constituted by a substrate provided with, e.g., a photocurable resin, a thermosetting resin, or a thermoplastic resin. The resin is deformed in a state in which the resin and the pattern of the mold contact each other. The photocurable resin and the thermosetting resin are hardened by light irradiation and heating, respectively. The thermoplastic resin is hardened by cooling it to room temperature after heating it.

The present invention further includes a pressure imprint apparatus and a pressure imprint method, which are characterized by the following constitutions.

More specifically, in this apparatus and method, a mold pressing portion (synonymous with mold holding portion or the first holding portion), for pressing for pressurizing a mold against a work (processing member) and a work pressing portion (support portion) disposed opposite to the mold via the work, are used. By using the portions, the work is pressed to transfer a pattern formed at a processing surface of the mold onto the work. The imprint apparatus includes a pressing mechanism for pressing the work by moving the mold in a work direction, a moving mechanism for moving the work in an in-plane direction, and a pressing position moving mechanism capable of moving a pressing position. By using these mechanisms, the work pressing portion is moved in a pressing axis direction and the pressing position is adjusted, thus effecting pressure processing. As a result, it is possible to provide an imprint apparatus and an imprint method, which are less affected by bending of the work due to its own weight and permit high-accuracy pressure processing without causing movement of the pressing axis.

During the adjustment of the pressing position, it is preferable that the pressing position is adjusted on the basis of the position of the processing member (work) and detection signals detected by using a detection mechanism for detecting an angle of work surface, a distance with the work surface, a load and a moment applied to the work pressing portion.

In place of the use of the detection mechanism, it is also possible to adjust the pressing position on the basis of a calculation result with respect to a position of a processing area at the work surface (a position of the processing member in an in-plane direction).

Further, it is also possible to adopt a constitution for correcting the position of the processing area by taking into account a change in pressing position during the pressing due to bending and deformation of the processing member and respecting parts.

Hereinafter, specific embodiments of the present invention will be described based on Embodiments 1 to 3.

Embodiment 1

In Embodiment 1, a pressure imprint apparatus according to this present invention is prepared. The pressure imprint apparatus is synonymous with a pattern transfer apparatus or an imprint lithography apparatus.

FIG. 8 shows a constitution of the pressure imprint apparatus of this embodiment. Referring to FIG. 8, the pressure imprint apparatus includes a housing 6100, a work holding portion 6101, a pressing portion moving mechanism 6102, a work support portion 6103, an xy-moving mechanism 6104, a work 6105, a pressing mechanism 6106, a mold holding portion 6107, a mold 6108, an angle detection mechanism 6109, a laser 6110, an exposure amount control circuit 6111, a pressure control circuit 6112, a pressing position detection circuit 6113, a position control circuit 6114 (for controlling a position of the processing member in an in-plane direction), a pressing position control circuit 6115, and a process control circuit 6116.

As shown in FIG. 8, the mold 6108 and the work 6105 (comprising a Si wafer and a photocurable resin coated thereon) are disposed opposite to each other. The mold 6108 is connected to the pressing mechanism 6106 via the mold holding portion 6107, and the work 6105 is held by the work holding portion 6101 via the xy-moving mechanism 6104. The work support portion 6103 is disposed opposite to the mold 6108 via the work 6105 and is connected to the pressing position moving mechanism 6102.

The work holding portion 6101 to which the xy-moving mechanism 6104 is attached, the pressing position moving mechanism 6102, and the pressing mechanism 6106 are connected to each other via the housing 6100. To a portion of the housing 6100, a UV light source 6117 is attached so that it is located opposite to a back surface of the mold 6108.

The angle detection mechanism 6109 detects light (reflected light) emitted from the laser 6110 and reflected at a central portion of a portion to be processed on the work 6105 or in the neighborhood thereof, i.e., an area in which a pattern is formed with the mold 6106 or in the neighborhood thereof.

The process control circuit 6116 provides instructions to the exposure amount control circuit 6111, the pressure control circuit 6112, the pressing position detection circuit 6113, the position control circuit 6114, and the pressing position control circuit 6115 to proceed with a process and receives data outputted from these circuits. The exposure amount control circuit 6111 controls the UV light source 6117 to effect light exposure. The pressure control circuit 6112 controls the pressing mechanism 6106 to press the mold 6108 against the work 6105. The pressing position detection circuit 6113 detects an angle of the portion to be processed (the pattern transfer area) on the work 6105 on the basis of a detection signal from the angle detection mechanism 6109. The position control circuit 6114 controls the xy-moving mechanism 6104 to control a position of the work 6105 in an in-plane direction (xy-direction shown in FIG. 8). The pressing position control circuit 6115 moves the pressing position moving mechanism 6102 in a pressing direction (z-direction shown in FIG. 8) to vertically move the work support portion 6103, thus adjusting the pressing position.

A pressure processing process in this embodiment will be described below.

First, the work support portion 6103 is sufficiently moved away from the work 6105 and then the work 6105 is moved to a desired portion to be processed (pattern transfer area).

Next, after the work support portion 6103 is caused to contact the work 6105, the work support portion 6103 pushes up the work 6105 so that the portion to be processed on the work 6105 located at an angle at which it is parallel to the mold 6108, thus determining a pressing position.

Then, the mold 6108 is pressed against the work 6105 and, in this state, is irradiated with UV rays to cure the photocurable resin on the work 6105. Thereafter, the mold 6108 is removed from the work 6105 to transfer a surface imprinted pattern of the mold 6108 onto the work 6105.

Incidentally, in the constitution of this embodiment, the pressing position is adjusted by moving the pressing position moving mechanism 6102 in the z-axis direction to vertically move the work support portion 6103, but the present invention is not limited only to such a constitution.

For example, the pressing position moving mechanism 6102 is changed to a fixed pressing mechanism and the work holding portion 6101 is changed to a mechanism vertically movable with respect to the housing 6100. By using these mechanisms, the pressing position may also be adjusted.

A method for appropriately correcting the pressing position in such a manner that the pressing position is determined by subtracting an amount of change from a position where the work 6105 and the mold 6108 is parallel to each other in consideration of a change in pressing position during the pressing due to bending of the respective members is also effective.

Further, in the case where the influence of the self-weight deformation of the work 6105 on the pressing force is sufficiently small, a position where the self-weight deformation of the work 6105 is not caused to occur is taken as the pressing position.

According to the constitution of this embodiment, the angle of the processing surface of the work 6105 is directly measured, so that the constitution is particularly suitable for the case where parallelism of both surfaces of the work 6105 is not ensured.

Figure 11:
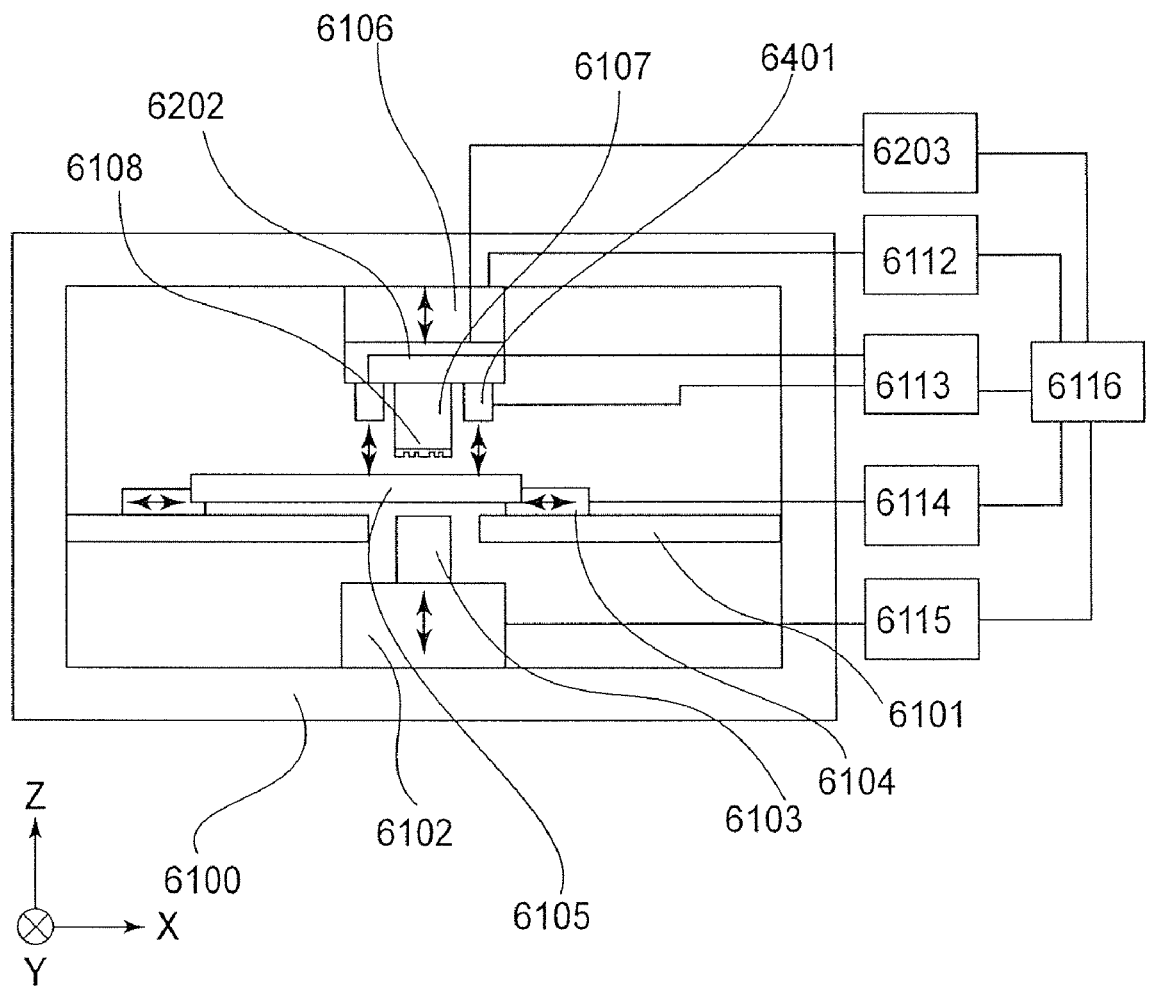

The influence of the bending of the work 6105 due to its own weight varies depending on the pressing position (the position of the processing member in the in-plane direction), but the correction result thereof can be measured directly, so that the constitution of this embodiment is also suitable for the case where a processing accuracy in the pressing direction is particularly required and the case where the pressing force is small. Further, the mechanism for detecting the pressing position is not limited to that used in this embodiment. For example, as shown in FIG. 11, another detection method of effecting measurement at a periphery of the processing member is also applicable. Other mechanisms and members are in common with those used in this embodiment.

Incidentally, a primary difference between the imprint lithography and a processing (light exposure) method using a so-called light exposure apparatus is that the imprint lithography requires that the mold is pressed against the work in order to transfer a minute structure on the mold onto the work, thus generating a pressing force which is not problematic in the imprint method using the light exposure apparatus.

In the case where processing is performed by using the pressure imprint method described in the above-mentioned document (Proceedings of the SPIE's 24th International Symposium on Microlithography: Emerging Lithographic Technologies III, Santa Clara, Calif., Vol. 3676, Part One, pp. 379-389, March (1999)), a position of an operating portion of the stage as a pressing member for transmitting the pressing force to the mold or the work and a position of the pressing axis with respect to the entire apparatus are changed to cause an unbalanced load exerted on these portions in some cases. As a result, there is a concern about a lowering in processing accuracy resulting from occurrences of a localized distribution of the pressing force and positional error due to deformation of the respective members. In the case where rigidity of the respective members is increased in order to prevent the deformation, a lowering in dynamic characteristic due to an increase in weight or an increase in size of the resultant apparatus is induced.

In this embodiment, the pressing axis is fixed, so that the problems described above can be alleviated.

Further, in the case of JP-A 2003-77867 described above, although the position of the pressing axis is kept, the work is held by the elastic member, so that it is difficult to hold rigidity in the in-plane direction of the work (perpendicular to the pressing axis), thus resulting in a difficulty in ensuring an accuracy of positioning.

Further, the work can cause bending by its own weight. A bending amount in this case varies depending on a manner of constraint, but is approximately 20 µm for a 300 nm Si wafer, even in the case of complete constraint at a circumferential portion and reaches approximately 80 µm in the case of a simple support. These values are increased with a decrease in number of constraint points and supporting points, so that when constraining and supporting members for this purpose are moved upwardly, a controllability of application of load for keeping parallelism of the work surface with the processing surface of the mold is considerably lowered.

According to this embodiment, it is possible to suppress the influence of bending due to the self weight of the work, so that a change in pressing force is small even when the pressing position of the work is changed, thus realizing high-accuracy positioning.

Embodiment 2

In Embodiment 2, a pressure imprint apparatus, having a constitution different from that in Embodiment 1, according to the present invention, is prepared.

Explanation of members and mechanisms in common with those in Embodiment 1 will be omitted and only explanation of a difference in constitution between Embodiments 1 and 2 will be made.

Figure 9:
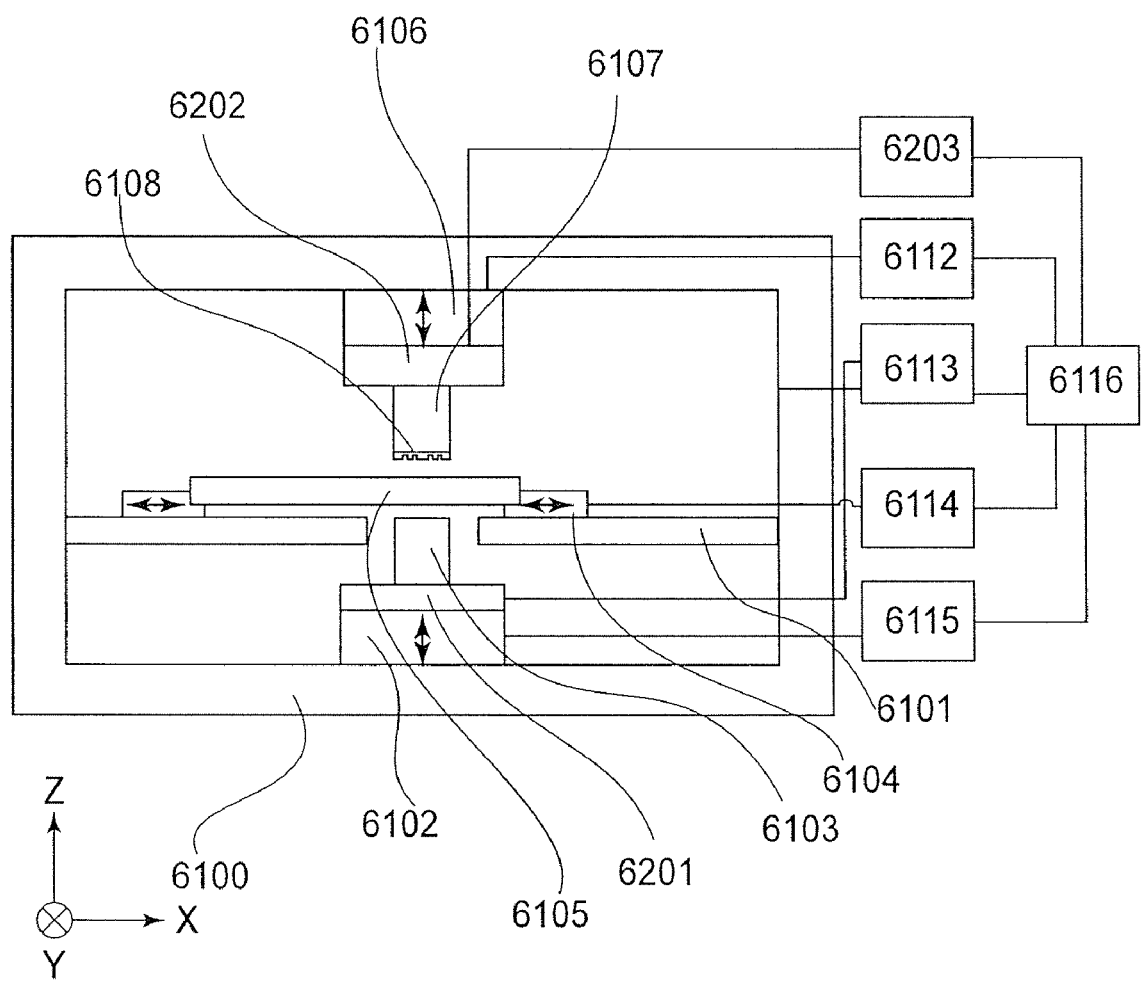

FIG. 9 shows a constitution of the pressure imprint apparatus of this embodiment.

Referring to FIG. 9, the pressure imprint apparatus includes a load detection mechanism 6201 and a heater 6202.

A primary difference of this embodiment from Embodiment 1 is that a pressing position is detected by using the load detection mechanism 6201, that the heater 6202 is disposed between the mold holding portion 6107 and the pressing mechanism 6106, and that in place of the UV curable resin, a thermoplastic resin is applied onto the surface of the work 6105.

Next, a pressure processing process in this embodiment will be described.

In this embodiment, a value of a load is detected by the load detection mechanism 6201 for detecting the pressing position. The work 6105 is bent due to self-weight deformation, so that, similarly as in Embodiment 1, the load value at the time when the portion to be processed on the work 6105 is located at an angle at which it is parallel to the mold 6108 is different depending on a position of the portion to be processed on the work 6105. For this reason, a load value corresponding to the position of the work 6105 is calculated and the pressing position moving mechanism 6102 is controlled to provide the calculated value of load.

The calculation of the load value may be performed by using an analytic solution when it is present in a supporting manner of the work 6105 or by applying an approximate equation to a calculation result of a numerical value according to a finite element method, or the like. Further, such a method that the load value is actually measured in advance, and the measured value of the load used is also effective in order to permit more precise processing.

Next, the mold 6108 heated via the mold pressing member 6107 by heat generation of the heater 6202 is pressed against the work 6105 to soften the thermoplastic resin on the work 6105. Thereafter, the mold 6108 is removed from the work 6105.

Incidentally, by subtracting a value at the pressing position from the load value, it is also possible to detect a pressing force by the load detection mechanism 6201.

Further, similarly as in Embodiment 1, a method of appropriately correcting the pressing position in such a manner that the pressing position is determined by subtracting an amount of change from a position where the work 6105 and the mold 6108 is parallel to each other in consideration of a change in pressing position during the pressing due to bending of the respective members is also effective. Further, in the case where the influence of the self-weight deformation of the work 6105 on the pressing force is sufficiently small, a position where the self-weight deformation of the work 6105 is not caused to occur is taken as the pressing position. Further, the mechanism for detecting the pressing position is not limited to that used in this embodiment. For example, another detection method of detecting a moment force by a triax force gage (using a strain gage or light interference, for example) in place of the load detection mechanism 6201 is also applicable.

According to this embodiment, the load detection mechanism 6201 is provided in the pressing axis, so that compact mounting is permitted and it is also possible to detect the pressing force simultaneously with the detection of the load. As a result, the constitution of this embodiment is effective in reducing the size and cost of the resultant apparatus.

Embodiment 3

In Embodiment 3, a pressure imprint apparatus, having a constitution different from that in Embodiment 1 and Embodiment 2, according to the present invention, is prepared.

Explanation of members and mechanisms in common with those in Embodiment 1 and Embodiment 2 will be omitted and only an explanation of a difference in constitution between Embodiments 2 and 3 will be made.

Figure 10:
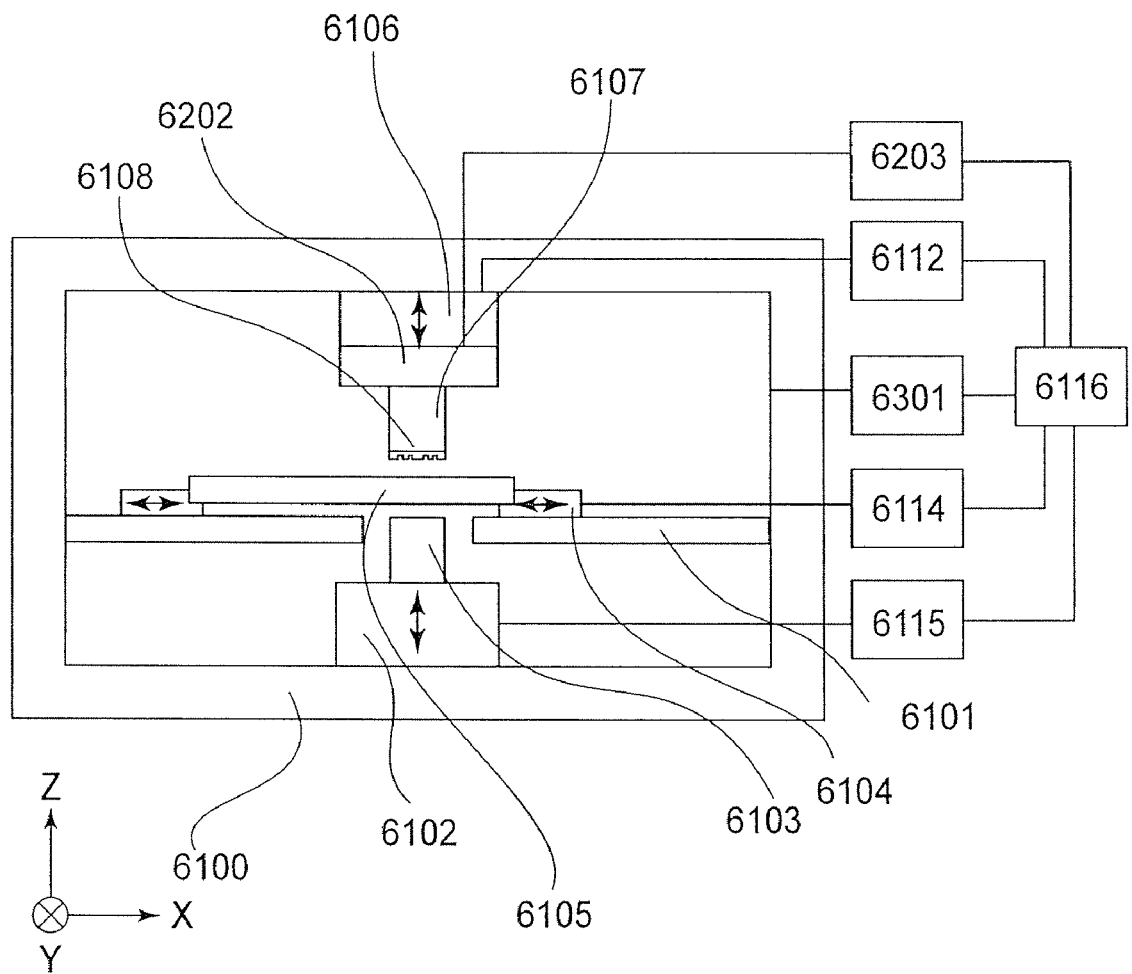

FIG. 10 shows a constitution of the pressure imprint apparatus of this embodiment.

Referring to FIG. 10, the pressure imprint apparatus includes a pressing position calculation (computation) circuit 6301.

A primary difference of this embodiment from Embodiment 2 is that a pressing position is determined by computation by the pressing position calculation circuit 6301 without using the load detection mechanism 6201.

Next, a pressure processing process in this embodiment will be described.

In this embodiment, a pressing position corresponding to the position of the work 6105 is calculated or computed, and the pressing position moving mechanism 6102 is controlled to move the pressing position to this position.

The calculation of the load value may be performed by using an analytic solution when it is present in a supporting manner of the work 6105 or by applying an approximate equation to a calculation result of a numerical value according to a finite element method, or the like. Further, such a method that the load value is actually measured in advance, and the measured value of load is used is also effective in order to permit more precise processing.

Further, similar to Embodiment 1 and Embodiment 2, a method of appropriately correcting the pressing position in such a manner that the pressing position is determined by subtracting an amount of change from a position where the work 6105 and the mold 6108 is parallel to each other in consideration of a change in pressing position during the pressing due to bending of the respective members is also effective. Further, in the case where the influence of the self-weight deformation of the work 6105 on the pressing force is sufficiently small, a position where the self-weight deformation of the work 6105 is not caused to occur is taken as the pressing position.

According to this embodiment, measurement with respect to the work 6105 is not performed during the processing thereof, so that an accuracy is lowered in some cases compared with Embodiments 1 and 2. However, the mechanism is simplified, so that the constitution of this embodiment is particularly suitable for an inexpensive imprint apparatus. Further, a detection process of the pressing position is omitted, so that a control speed is increased and thus the constitution of this embodiment is also suitable for an imprint apparatus providing high throughput.

Next, in the above-described pressure processing process, a preferred embodiment capable of obviating concentration of pressing force, or the like, will be described.

Figure 12:
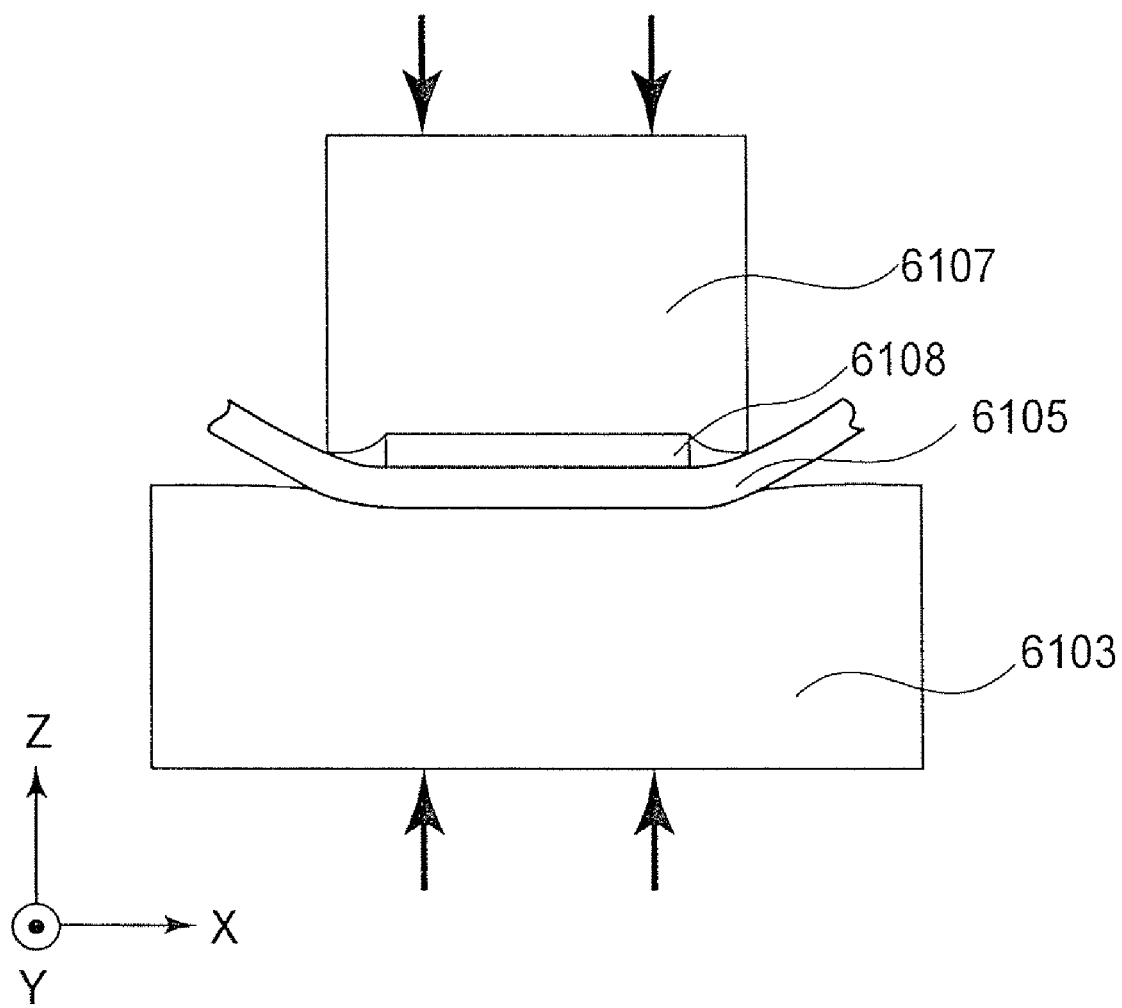
Figure 13:
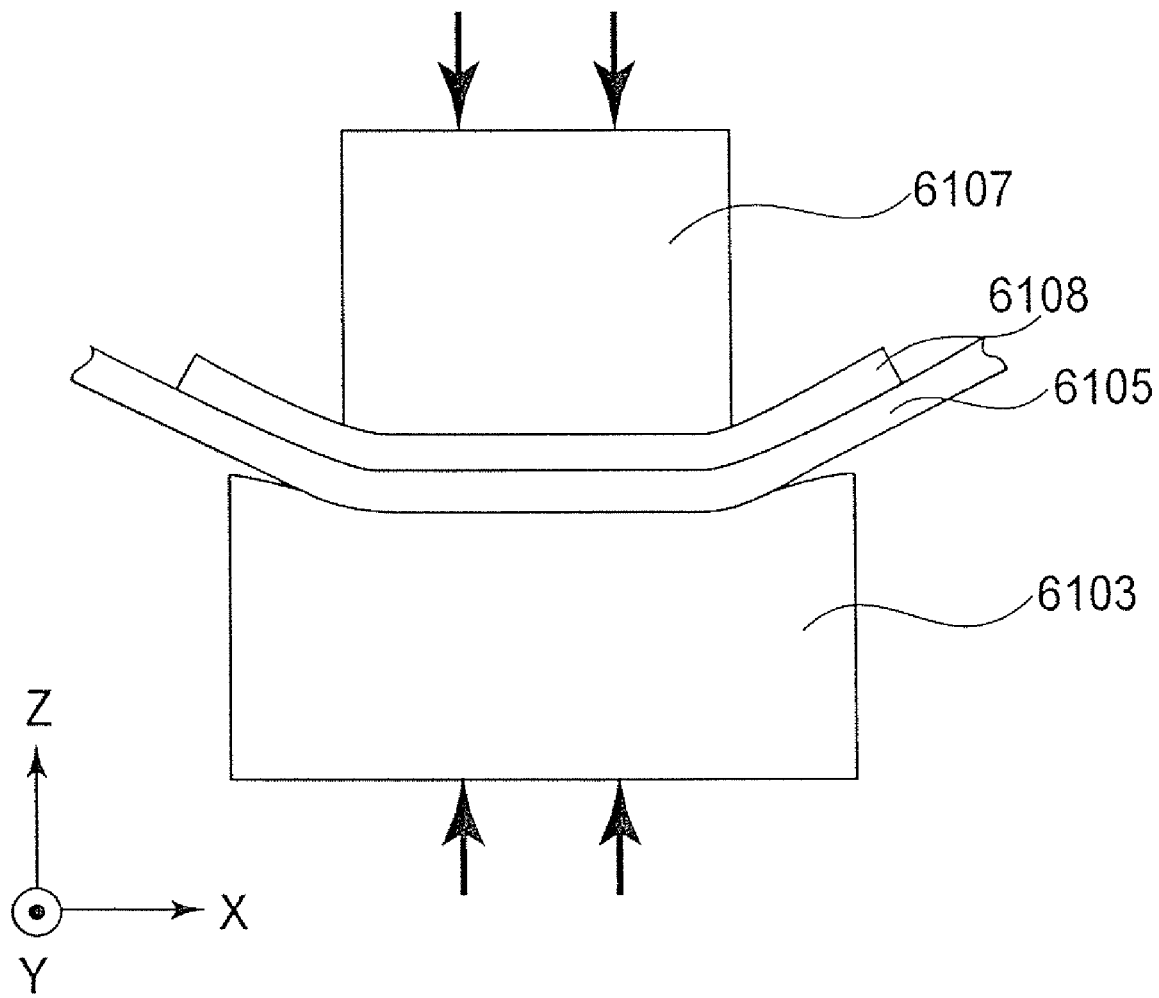
Figure 14:
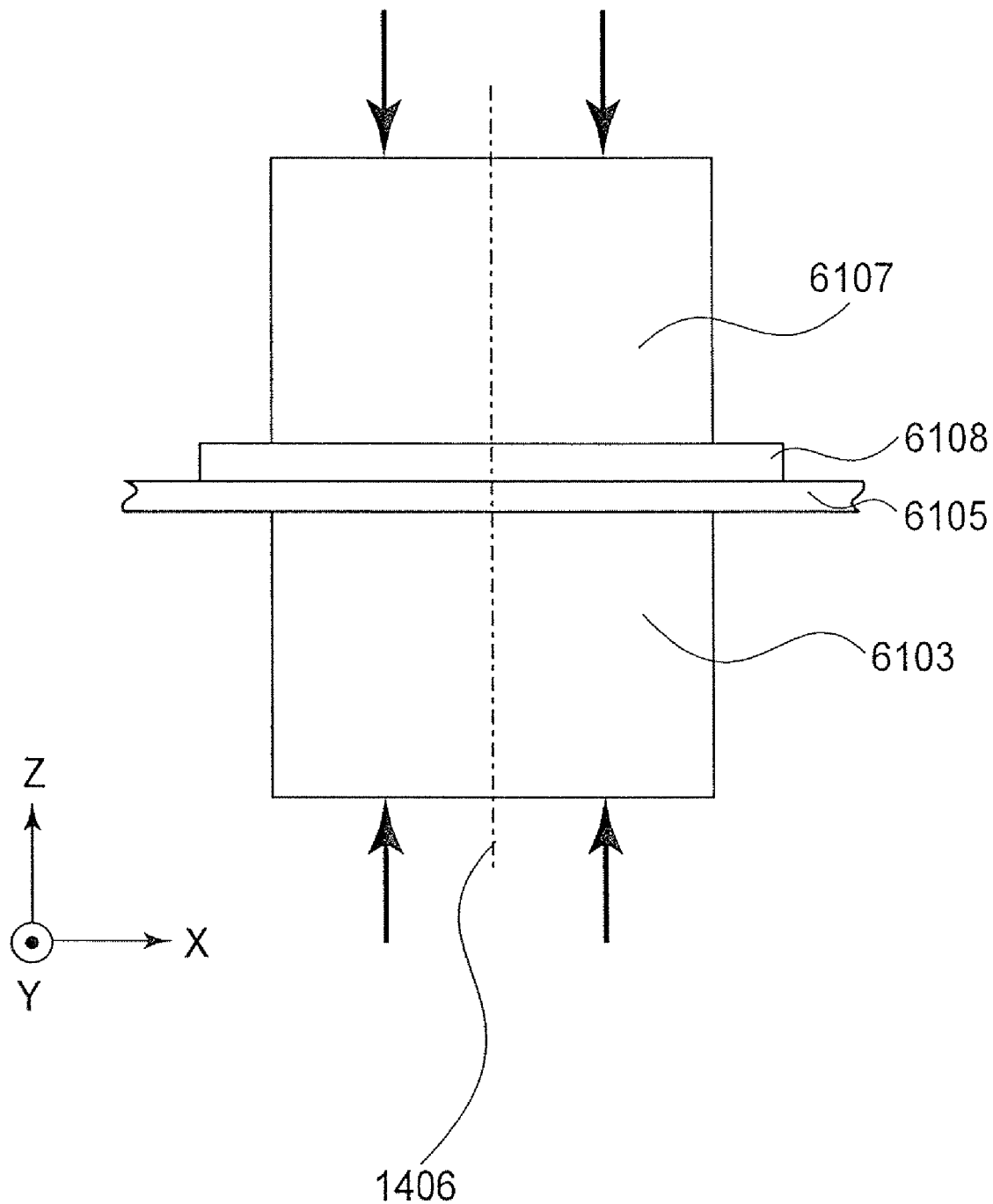

FIGS. 12 to 14 show a contact state between the mold 6108 and the work 6105.

FIG. 12 is an embodiment in which the mold 6108 is constituted so that it has a size smaller than those of the mold holding portion 6107, the work 6105, and the work support portion 6103.

The constitution shown in FIG. 12 is suitable for the case where a size of a processing portion is frequently changed, since the constitution only requires an appropriate change in size of the mold even when the size of the processing portion is changed.

However, in the case where the mold and the work are very brittle or in the case where the mold and the wafer are very thin and a processing force is large, the following problems have arisen.

More specifically, the mold 6108 is smaller in size than the mold holding portion 6107, the work 6105, and the work support portion 6103, so that the processing force is concentrated at a peripheral portion of the mold 6108 to cause concentration of stress in some cases. In such a state, in the case where the mold and the work are brittle, breakage thereof can be caused to occur. Alternatively, the surface of the mold holding portion 6107 can be damaged.

Particularly, e.g., in the case where the mold and the wafer is thin, i.e., not more than 1 mm in thickness and the processing force is large, non-uniformity due to the above-mentioned concentration of the processing force is reflected in a contact surface of the mold with the work substantially as it is. As a result, non-uniformity of processing depth is induced in some cases.

In the case where the above-described problems are caused to occur, e.g., as shown in FIG. 13, by using the mold holding portion 6107 contacting the mold 6108 at a surface smaller in area than the surface of the mold 6108, it is possible to reduce a portion at which the processing force is concentrated to remedy the problems. A similar effect is also achieved by using a smaller work support portion 6103. Further, it is desirable that planes of both of the pressing members, i.e., the mold holding portion 6107 and the work support portion 6103 are symmetrical. For example, in a constitution shown in FIG. 14, both of the pressing members are cylindrical members 6103 and 6107 having a certain sectional shape perpendicular to a processing axis 1406. A surface of the cylindrical member 6103 contacting the work 6105 and a surface of the cylindrical member 6107 contacting the mold 6108 are symmetrical.

A distribution of the processing force in the constitution of this embodiment is substantially close to a distribution of stress of a cross-sectional surface perpendicular to the pressing axis direction in the pressing axis direction during compression of the cylindrical members in the pressing axis direction, so that it is possible to obtain a uniform distribution of the processing force at the inner processing surfaces of the pressing members (the mold holding portion 6107 and the work support portion 6103).

Accordingly, particularly, in the case where pattern transfer is effected under conditions that the thicknesses of the mold and the work are small and the processing force is relatively large, the constitution shown in FIG. 14 is effective.

For example, when a 1 mm-thick Si wafer is used to constitute a mold and a work and the mold and the work are pressed between circular cylindrical iron-made pressing members each having a diameter of 25 mm at a pressure of 100 MPa, a distribution of a processing force can be suppressed to approximately 5%. Such a constitution is also applicable to the above-described respective embodiments.

What is claimed is:

1. An imprint method comprising:
 (i) holding a mold by a first holding portion;
 (ii) holding, by a second holding portion, a member to be processed so that the member to be processed is capable of bending by its own weight;
 (iii) supporting, by a support portion, a back surface of the member to be processed in a first area so that an amount of the bending is decreased;
 (iv) pressing a pattern of the mold against a front surface of the member to be processed, which is supported by the support portion in the first area;
 (v) supporting, by the support portion, the back surface of the member to be processed in a second area different from the first area, so that the amount of the bending is decreased, by changing a relative position between the member to be processed and the support portion; and
 (vi) pressing the pattern of the mold against the front surface of the member to be processed, which is supported by the support portion in the second area.

2. A method according to claim 1, wherein the member to be processed is a substrate or a resin material applied on the substrate.

3. A method according to claim 1, wherein the member to be processed has a plate-like shape and the second holding portion holds a peripheral area of the member to be processed so as not to contact an in-plane central area of the member to be processed.

4. A method according to claim 1, wherein at least one of an area of a surface, of the first holding portion, contacting the mold and an area of a surface, of the support portion, contacting the member to be processed is smaller than an area of a processing surface of the mold and an area of a pattern forming surface of the member to be processed.

5. A method according to claim 1, wherein a surface, of the first holding portion, contacting the mold and a surface, of the support portion, contacting the member to be processed have a plane symmetry relationship.

6. A method according to claim 1, further comprising pushing up the member to be processed so that a portion where the member to be processed contacts the mold in an in-plane area thereof is parallel to the processing surface of the mold on which the pattern is formed.

7. A method according to claim 1, wherein the processing surfaces of the mold and the member to be processed are caused to contact each other at a pressurizing position after the pressurizing position is adjusted by causing the support portion and the member to be processed to contact each other.

8. A method according to claim 1, wherein the support portion and the member to be processed are caused to contact each other after the processing surface of the mold and the member to be processed are caused to contact each other.

9. A method according to claim 1, wherein the support portion partially supports the member to be processed at a position opposite to the mold held by the first holding portion.

10. A process for producing a chip, said process comprising:
    (a) preparing a mold having a pattern;
    (b) preparing a member to be processed or a member having a pattern forming material on the member to be processed; and
    (c) forming an imprinted pattern on the member to be processed or the pattern forming material on the member to be processed, by using an imprint method according to claim 1.

11. A process for producing a chip according to claim 10, further comprising utilizing the imprinted pattern formed on the member to be processed as a mask.

12. A process for producing a chip according to claim 10, wherein the pattern forming material comprises one of a photocurable resin, a thermosetting resin, and a thermoplastic resin.

13. A process for producing a chip according to claim 12, wherein the imprinted pattern is formed by causing the resin and the pattern of the mold to contact each other.

14. A process for producing a chip according to claim 10, wherein the position of the support portion in the direction perpendicular to the plane is changed so that the member to be processed is bent convexly upward in the direction of gravitation.

15. A process for producing a chip according to claim 10, wherein the imprinted pattern is formed by causing the resin and the pattern of the mold to contact each other.

* * * * *